US012313655B2

(12) United States Patent
Maggioni

(10) Patent No.: US 12,313,655 B2
(45) Date of Patent: *May 27, 2025

(54) TESTING HEAD HAVING IMPROVED FREQUENCY PROPERTIES

(71) Applicant: TECHNOPROBE S.P.A., Cernusco Lombardone (IT)

(72) Inventor: Flavio Maggioni, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/416,771

(22) Filed: Jan. 18, 2024

(65) Prior Publication Data

US 2024/0151744 A1 May 9, 2024

Related U.S. Application Data

(63) Continuation of application No. 18/329,475, filed on Jun. 5, 2023, now Pat. No. 11,921,133, which is a (Continued)

(30) Foreign Application Priority Data

Dec. 16, 2016 (IT) .......................... 102016000127581
Feb. 24, 2017 (IT) .......................... 102017000021389

(51) Int. Cl.
*G01R 1/073* (2006.01)
*G01R 1/067* (2006.01)

(52) U.S. Cl.
CPC ..... *G01R 1/07378* (2013.01); *G01R 1/06772* (2013.01); *G01R 1/07328* (2013.01); *G01R 1/07357* (2013.01); *G01R 1/07371* (2013.01)

(58) Field of Classification Search
CPC ............ G01R 1/07378; G01R 1/06772; G01R 1/07328; G01R 1/07357; G01R 1/07371
(Continued)

(56) References Cited

U.S. PATENT DOCUMENTS 4,622,514 A    11/1986  Lewis
5,225,777 A     7/1993  Bross et al.
(Continued)

FOREIGN PATENT DOCUMENTS

CN    102466739 A    5/2012
CN    102466739 B    4/2014
(Continued)

OTHER PUBLICATIONS

"rheophore," *Wiktionary*, edited Mar. 17, 2019, retrieved from https://en.wiktionary.org/w/index.php?title=rheophore&oldid-51978536.
(Continued)

*Primary Examiner* — Raul J Rios Russo
*Assistant Examiner* — Trung Q Nguyen
(74) *Attorney, Agent, or Firm* — Seed IP Law Group LLP

(57) ABSTRACT

A testing head apt to verify the operation of a device under test integrated on a semiconductor wafer includes a plurality of contact elements, each including a body that extends between a first end portion and a second end portion, and a guide provided with a plurality of guide holes apt to house the contact elements. The guide includes a conductive portion that includes and electrically connects the holes of a group of guide holes to each other and is apt to contact a corresponding group of contact elements apt to carry a same type of signal.

16 Claims, 13 Drawing Sheets

Related U.S. Application Data continuation of application No. 17/325,783, filed on May 20, 2021, now Pat. No. 11,808,788, which is a continuation of application No. 16/442,385, filed on Jun. 14, 2019, now Pat. No. 11,035,885, which is a continuation-in-part of application No. PCT/EP2017/082180, filed on Dec. 11, 2017.

(58) Field of Classification Search
USPC .... 324/756.01, 600, 754.03, 763.01, 756.03, 324/750.22–750.25, 754.08, 750.03, 324/750.07, 750.23, 755.01, 756.07, 500
See application file for complete search history.

(56) References Cited

U.S. PATENT DOCUMENTS

| | | | |
|---|---|---|---|
| 5,519,331 A | 5/1996 | Cowart et al. | |
| 6,255,832 B1 | 7/2001 | Notohardjono et al. | |
| 6,417,684 B1 | 7/2002 | Schmid et al. | |
| 8,723,538 B2* | 5/2014 | Hung | G01R 1/07371 324/750.19 |
| 8,803,539 B2* | 8/2014 | Rathburn | G01R 1/07314 324/755.01 |
| 8,994,393 B2 | 3/2015 | Ding et al. | |
| 9,470,715 B2 | 10/2016 | Fan et al. | |
| 10,281,491 B2 | 5/2019 | McQuade et al. | |
| 11,035,885 B2 | 6/2021 | Maggioni | |
| 2007/0017702 A1 | 1/2007 | Schmid et al. | |
| 2008/0139017 A1 | 6/2008 | Kiyofuji et al. | |
| 2009/0085593 A1 | 4/2009 | Yoshida et al. | |
| 2011/0043232 A1* | 2/2011 | Takase | G01R 1/07342 324/755.01 |
| 2012/0025859 A1 | 2/2012 | Huang et al. | |
| 2012/0242360 A1 | 9/2012 | Huang et al. | |
| 2013/0299221 A1 | 11/2013 | Oh et al. | |
| 2014/0062519 A1 | 3/2014 | Ding et al. | |
| 2014/0091826 A1 | 4/2014 | Chui | |
| 2014/0197860 A1 | 7/2014 | Hsu et al. | |
| 2015/0028912 A1 | 1/2015 | Cho et al. | |
| 2015/0107102 A1 | 4/2015 | Lee et al. | |
| 2015/0198632 A1 | 7/2015 | Kim | |
| 2015/0309074 A1 | 10/2015 | Kuo et al. | |
| 2016/0223590 A1* | 8/2016 | Hsu | G01R 1/07357 |
| 2018/0003767 A1* | 1/2018 | Crippa | G01R 1/07357 |
| 2018/0011126 A1* | 1/2018 | Acconcia | G01R 1/06733 |
| 2018/0024167 A1 | 1/2018 | Maggioni | |
| 2019/0348734 A1* | 11/2019 | Kim | H01Q 1/241 |
| 2021/0270869 A1 | 9/2021 | Maggioni | |

FOREIGN PATENT DOCUMENTS

| | | |
|---|---|---|
| CN | 203658412 U | 6/2014 |
| JP | H11248745 A | 9/1999 |
| JP | H11352182 A | 12/1999 |
| JP | 2007171138 A | 7/2007 |
| JP | 2007178165 A | 7/2007 |
| JP | 2012159422 A | 8/2012 |
| KR | 101384714 B1 | 4/2014 |
| KR | 10-1421051 B1 | 7/2014 |
| KR | 101467383 B1 | 12/2014 |
| TW | 201441628 A | 11/2014 |
| TW | 201522974 A | 6/2015 |
| TW | 201640123 A | 11/2016 |
| WO | WO 2005006003 A1 | 1/2005 |
| WO | WO 2012106220 A1 | 8/2012 |
| WO | 2016177850 A1 | 11/2016 |

OTHER PUBLICATIONS

Schwartz, Rod, "Introduction to Probe Cards," (1998 SWTest Conference), 1998. (64 pages).

Taber, Frederick L., "Declaration of Frederick L. Taber," FormFactor EX. 1003, *FormFactor v. Technoprobe*, IPR2024-00933, June 26, 2024. (171 pages)

Pearce, T. Vann, Jr., "Petition for Inter Partes Review of U.S. Pat. No. 11,035,885 B2," *FormFactor v. Technoprobe*, IPR2024-00933, Jun. 28, 2024. (91 pages).

"SWTest Workshop: Semiconductor Wafter Test Workshop," SWTest Willtechnology Presentation Jun. 7, 2016 Podium, Rancho Bemardo Inn, San Diego, CA, Jun. 5-8, 2016. (256 pages).

Chang, Kyung Hyun et al., "A proposal of a new probe head design in vertical probe cards for low crosstalk and PDN impedance," SW Test Workshop, June 5-8, 2016. (19 pages)

Excerpt of Prosecution History, Japanese Patent Application No. 2019-531897, Oct. 19, 2021 to Feb. 13, 2023 (37 pages) (with 43-page translation).

"Patent Invalidation Reasons," submitted to Taiwan Intellectual Property Office, Jul. 9, 2024 (with translation). (64 pages).

WayBack Machine, Capture date: Jun. 11, 2024; Estimated post date: Jun. 3, 2016, URL=https://web.archive.org/web/20160603185558/http:/www.swtest.org/, retrieved on Dec. 31, 2024. (10 pages).

Wayback Machine, Capture date: Jun. 11, 2024, URL=https://web.archive.org/web/20161206183907/http:swtest.org/e_proceedings/SWTW2016_07-June_Tue+ePodium.pdf, retrieved Dec. 31, 2024. (259 pages).

Prosecution History of EP17825770.5 published as EP3555638A1 (including search report and opinion from priority applications IT 201600127581 and IT 20170021389 and documents from the prosecution history of priority application PCT/2017/082180 published as WO2018108790A1), Dec. 11, 2017 to Aug. 10, 2023. (467 pages).

* cited by examiner

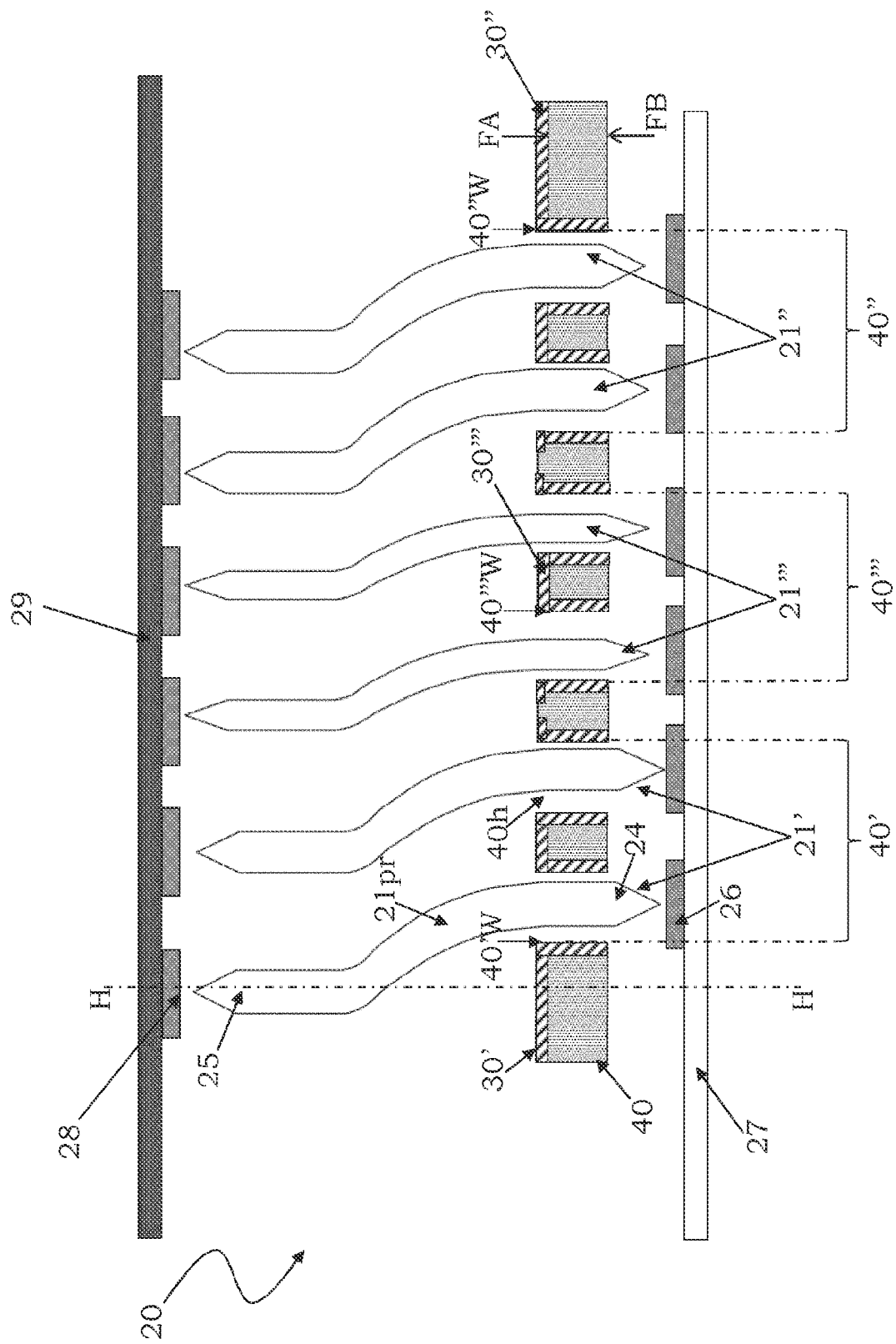

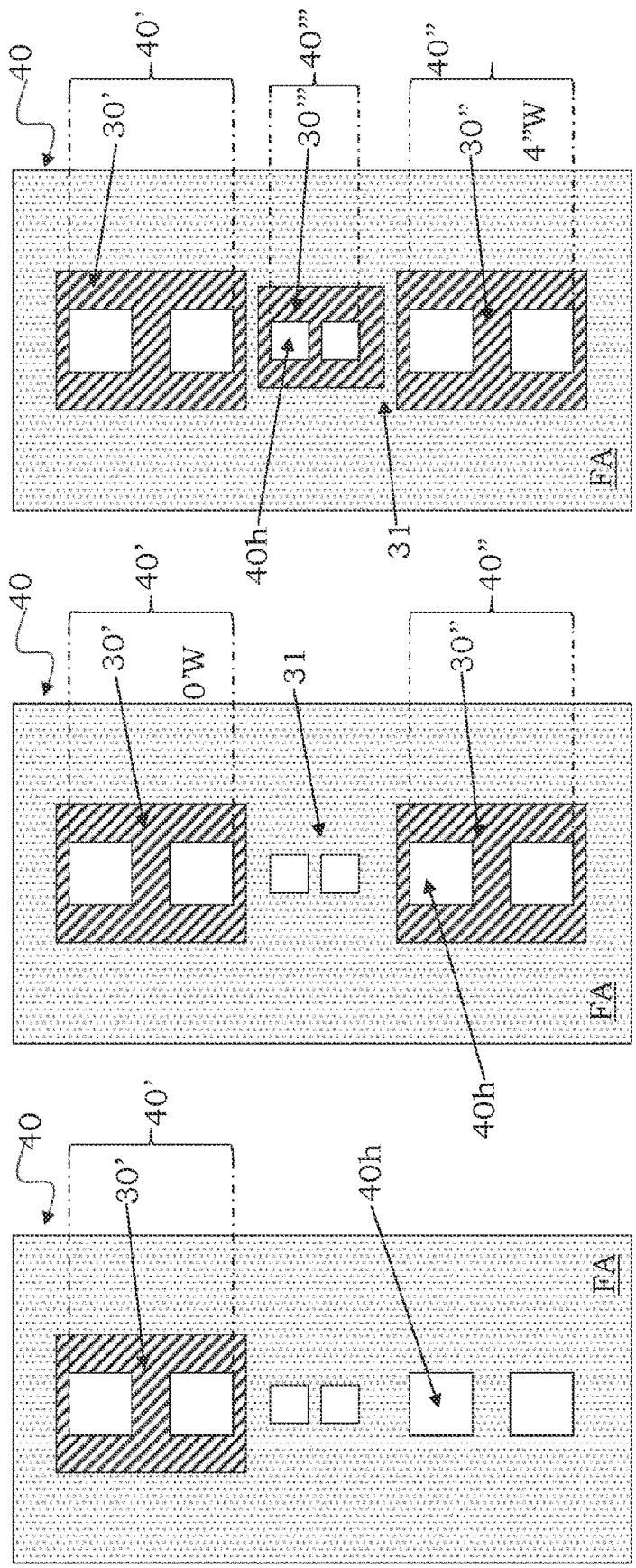
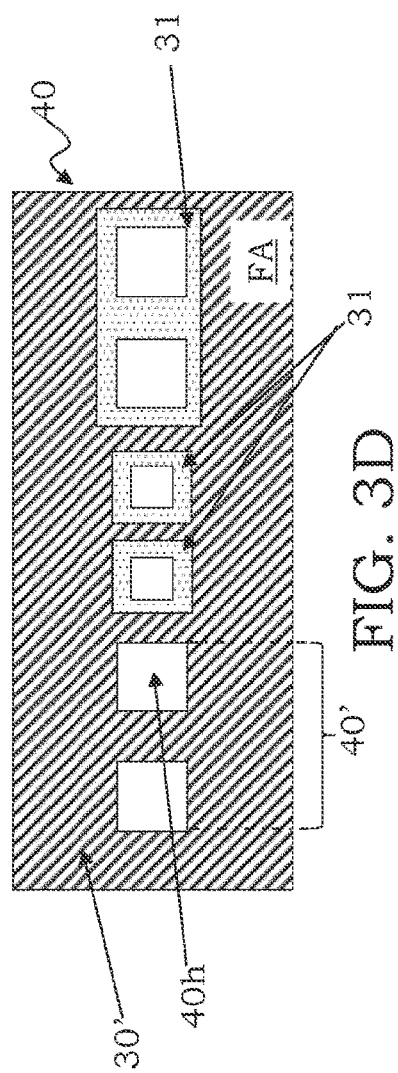
FIG. 3A
FIG. 3B
FIG. 3C
FIG. 3D

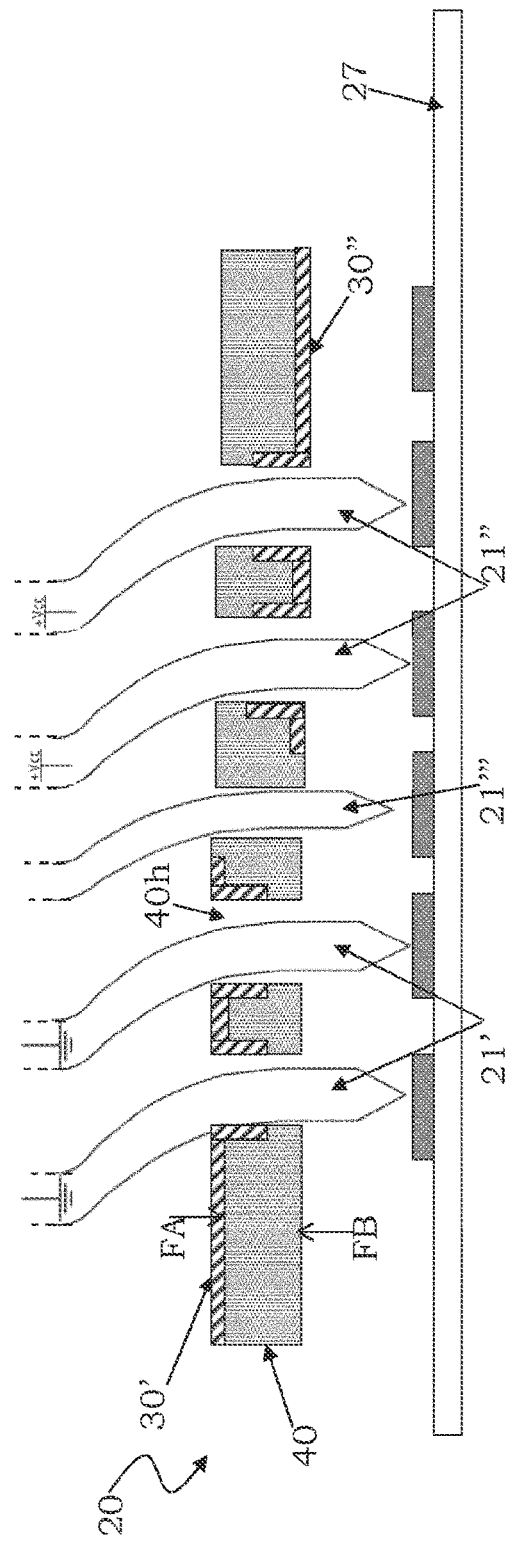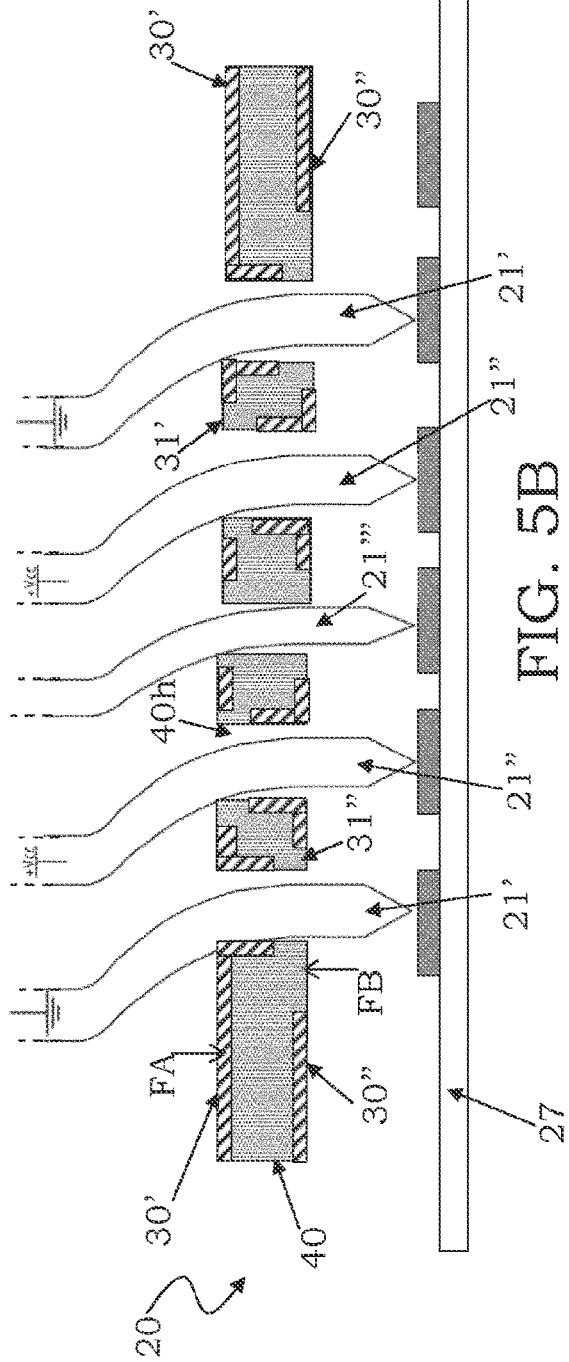

TESTING HEAD HAVING IMPROVED FREQUENCY PROPERTIES

BACKGROUND

Technical Field

The present disclosure relates to a testing head for testing electronic devices integrated on a semiconductor substrate. More in particular, the present disclosure relates to a testing head comprising at least one guide provided with a plurality of guide holes apt to house a plurality of contact elements, and the following description is made with reference to this application field with the only purpose of simplifying the exposition.

Description of the Related Art

As it is well known, a testing head (probe head) is a device apt to place a plurality of contact pads of a microstructure, such as an electronic device integrated on a wafer, into electrical contact with corresponding channels of a testing machine performing the working test thereof, in particular the electrical one, or generically the test.

The test, which is performed on integrated devices, is particularly useful to detect and isolate defective devices yet in the manufacturing step. Generally, the testing heads are thus used to electrically test the devices that are integrated on a wafer before cutting and assembling them inside a chip containing package.

Generally, a testing head comprises a plurality of contact elements or contact probes retained by at least one guide or by at least one pair of guides (or supports) which are substantially plate-shaped and parallel to each other. Those guides are provided with suitable holes and are arranged at a certain distance from each other so as to leave a free space or air gap for the movement and the possible deformation of the contact probes, which are slidingly housed in those guide holes. The pair of guides comprises in particular an upper guide and a lower guide, both provided with respective guide holes where the contact probes axially slide, the probes being usually made of wires of special alloys having good electrical and mechanical properties.

The good connection between the contact probes and the contact pads of the device under test is guaranteed by pressing the testing head on the device itself, the contact probes undergoing a bending inside the air gap between the guides and a sliding within the respective guide holes during that pressing contact. Testing heads of this kind are usually called "vertical probe head".

Substantially, the vertical probe testing heads have a gap in which the bending of the contact probes occurs, the bending being possibly assisted by means of a suitable configuration of the probes themselves or of their guides, as schematically shown in FIG. 1.

In particular, FIG. 1 schematically shows a testing head 1 comprising at least one upper guide 2, usually indicated as "upper die", and a lower guide 3, usually indicated as "lower die", separated by a gap 13, having respective guide holes 4 and 5 in which a plurality of contact probes 6 slides, only one probe of the plurality of contact probes being shown in FIG. 1 for the sake of simplicity.

Each contact probe 6 terminates at an end with a contact tip 7 apt to abut onto a contact pad 8 of a device under test integrated on a wafer 9, in order to carry out the mechanical and electrical contact between the device under test and a test equipment (not shown) of which such a testing head is a terminal element.

Here and hereinafter, the term "contact tip" indicates an end zone or region of a contact probe apt to contact a contact pad of the device under test, such an end zone or region not necessarily being sharp.

In some cases, the contact probes are fixedly fastened to the testing head at the upper guide: in such cases, the testing heads are referred to as "blocked probe testing heads".

More frequently, testing heads having probes not fixedly fastened are used, those probes being interfaced to a board, possibly by means of a micro-contact board: those testing heads are referred to as "non-blocked probe testing heads". The micro-contact board is usually called "space transformer" since, besides contacting the probes, it also allows to spatially redistribute the contact pads made on it with respect to the contact pads of the device to be tested, in particular relaxing the distance constraints between the centers of the pads themselves.

In this case, as shown in FIG. 1, each contact probe 6 has a further end zone or region which terminates with a so-called contact head 10 towards a contact pad 11 of a plurality of contact pads of a space transformer 12. The good electrical contact between probes 6 and space transformer 12 is ensured by the pressing contact of the testing heads 10 of the contact probes 6 on the contact pads 11 of the space transformer 12, analogously to the contact between the contact tips 7 and the contact pads 8 of the device under test integrated on the wafer 9.

Contact elements in the form of pogo pins are also known in the art, the pogo pins essentially comprising an elastic body connected to two end portions, the elastic body compressing upon contact of the end portions with the contact pads of the device under test and of the space transformer.

Generally, inside a testing head, the contact elements are divided into contact elements apt to carry power and ground signals towards the device under test, and into contact elements apt to carry operating signals, in particular input/output signals, between the test equipment and the device under test.

In the case of a testing head of the kind described above, it is well known that the presence of several contact elements apt to carry ground signals, as well as the presence of contact elements apt to carry power signals, creates interferences, therefore causing noise in the input/output signals used for the test of the device under test, which limits the frequency performance of the testing head. In the case of contact elements apt to carry ground signals, disadvantageous ground loops may also occur.

The possible necessity of shorting two or more contact pads of the device under test is also known. According to a known solution, known in the field as "loop-back", it is possible to short two contact pads of the device under test by means of the contact probes of the testing head, wherein a first probe carries a signal from a first pad of the device under test towards the test equipment and then the signal is closed on a second pad of the device under test by means of a second contact probe which contacts said second pad. In this case, however, the long path of the signal from the device under test to the test equipment and vice versa causes a reduction of the frequency performance of the testing head.

Conductive structures apt to electrically connect contact probes to each other are disclosed for example in US 2012/0242360 A1, KR 101 421 051 B1, US 2014/0197860 A1, and WO 2012/106220 A1.

However, the need to improve the frequency performances of a testing head is strongly felt in this technical field.

BRIEF SUMMARY

The testing head is able to reduce a simple way (and to eliminate in a simple way too) the interferences, and therefore the noise, caused by the presence of ground and power contact elements, as well as able to allow an electrical connection between contact pads of a device under test without reducing the frequency performances of the testing head itself.

According to an aspect of the disclosure, the testing head wherein at least one guide is provided with guide holes for housing contact elements apt to carry operating signals, i.e., input/output signals between a test equipment and a device under test, as well as contact elements apt to carry ground and power signals, at least one group of the guide holes into which said ground contact elements are housed, and/or at least one group of the guide holes into which said power contact elements are housed, and/or at least one group of the guide holes into which said input/output contact elements are housed being electrically connected by a conductive portion made in the guide, said conductive portion forming a common conductive plane.

The testing head apt to verify the operation of a device under test integrated on a semiconductor wafer comprises:
- a plurality of contact elements, each comprising a body that extends between a first end portion and a second end portion, and
- a guide provided with a plurality of guide holes apt to house the contact elements, wherein the guide comprises a conductive portion that includes and electrically connects the holes of a group of guide holes to each other and is apt to contact a corresponding group of contact elements apt to carry a same type of signal.

According to an aspect of the present disclosure, the testing head can comprise at least one first conductive portion and at least one second conductive portion, the first conductive portion including and electrically connecting the holes of a first group of the guide holes to each other, such a first group housing first contact elements, the second conductive portion including and electrically connecting the holes of a second group of the guide holes to each other, such a second group housing second contact elements.

In particular, the first contact elements housed in the first group of the guide holes can be apt to carry ground signals, and the second contact elements housed in the second group of the guide holes can be apt to carry power signals.

More in particular, one of the first and second conductive portions can be formed on a face of the at least one guide, and the other one of the first and second conductive portions can be formed on an opposite face of the at least one guide.

According to an aspect of the present disclosure, the at least one conductive portion can be separated from further conductive portions and/or can be locally interrupted by at least one non-conductive zone, so as not to allow an electrical connection between contact elements apt to carry a different type of signal and/or contact elements which must not be short-circuited.

It is observed that the at least one guide can comprise at least one coating dielectric portion covering the at least one non-conductive zone.

Furthermore, the testing head can comprise at least one lower guide, at least one intermediate guide, and at least one upper guide, the lower guide and the intermediate guide being separated from each other by a first gap, the intermediate guide and the upper guide being separated from each other by a second gap, each of those guides comprising respective guide holes for the housing of the contact elements, one of the first and second conductive portion being formed on a face of the lower guide and the other one of the first and second conductive portion being formed on a face of the intermediate guide.

Alternatively, the testing head can comprise at least one lower guide, at least one intermediate guide, and at least one upper guide, the lower guide and the intermediate guide being separated from each other by a first gap, the intermediate guide and the upper guide being separated from each other by a second gap, each of those guides comprising respective guide holes for the housing of the contact elements, both the lower guide and the intermediate guide comprising both the first conductive portion and the second conductive portion, the first conductive portion and the second conductive portion being physically and electrically separated from each other by a non-conductive zone of the guides.

In particular, in this case too, the first contact elements housed in the first group of the guide holes can be apt to carry ground signals, and the second contact elements housed in the second group of the guide holes can be apt to carry power signals.

Furthermore, the testing head can comprise at least one third conductive portion that includes and electrically connects the holes of a third group of the guide holes to each other, such a third group housing third contact elements. In particular, the third contact elements housed in the third group of the guide holes can be apt to carry input/output signals between the device under test and a test equipment.

According to an aspect of the present disclosure, the at least one conductive portion can cover at least one portion of an inner surface of each guide hole of the group of guide holes.

According to another aspect of the present disclosure, the contact elements can be contact probes wherein the body has a deformation.

Alternatively, the contact elements can be pogo pins, the body comprising a casing and an elastic member arranged in the casing, the casing defining a first surface and a second surface, at least one of those surfaces being apt to abut onto the at least one guide, the electrical connection between the contact elements and the at least one conductive portion being a pressing contact through the first and/or second surface.

According to an aspect of the present disclosure, the at least one guide can comprise at least one common pad connected to the at least one conductive portion by means of a conductive track.

According to another aspect of the present disclosure, the at least one conductive portion can be arranged on a face of the at least one guide and can have a lower area than an area of the face of the at least one guide.

Alternatively, the at least one conductive portion can cover a face of the at least one guide, such a conductive portion electrically connecting the holes of the at least one of the guide holes to each other, with the exception of areas where guide holes not belonging to that at least one group are formed.

According to another aspect of the present disclosure, the at least one guide can comprise at least one further conductive portion, which includes one of the guide holes apt to house a single contact element, the at least one guide comprising a further common pad connected to the at least one further conductive portion by means of a further conductive track and/or comprising a conductive track that connects the at least one further conductive portion to other conductive portions.

It is also noted that the at least one conductive portion can be embedded in the at least one guide.

According to another aspect of the present disclosure, the at least one conductive portion can comprise a plurality of conductive portions overlapped to and electrically insulated from each other.

According to yet another aspect of the present disclosure, the testing head can comprise at least one conductive track that electrically connects at least two conductive portions including and electrically connecting the holes of two respective groups of guide holes to each other and being apt to contact respective groups of contact elements, the contact elements included in those respective groups being apt to carry a same type of signal.

Finally, the testing head can further comprise at least one circuit component, preferably a capacitor, which is electrically connected at least to the at least one conductive portion of the at least one guide.

The features and advantages of the testing head according to the disclosure will become apparent from the following description of an embodiment thereof, given by way of non-limiting example with reference to the accompanying drawings.

BRIEF DESCRIPTION OF THE SEVERAL VIEWS OF THE DRAWINGS

FIGS. 2A-2C schematically show a testing head according to different embodiments of the present disclosure;

FIGS. 3A-3C schematically show a top view of a guide of the testing head of FIGS. 2A-2C, respectively, whereas FIG. 3D schematically shows a top view of a guide of a testing head according to an alternative embodiment of the present disclosure;

FIGS. 5A and 5B schematically show a portion of a testing head according to further alternative embodiments of the present disclosure;

DETAILED DESCRIPTION

Figure 1:
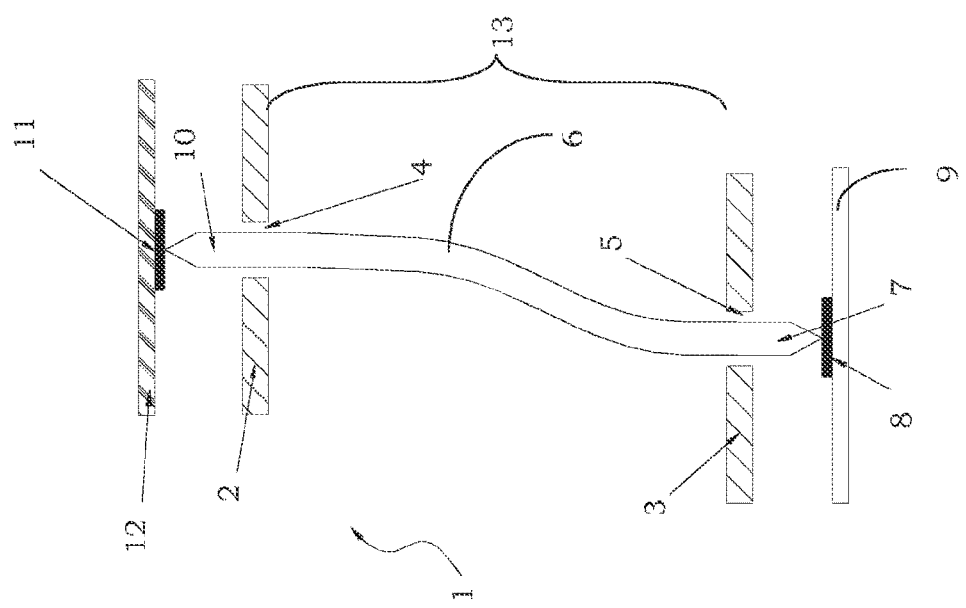
FIG. 1 schematically shows a testing head according to the prior art.
Figure 2A:
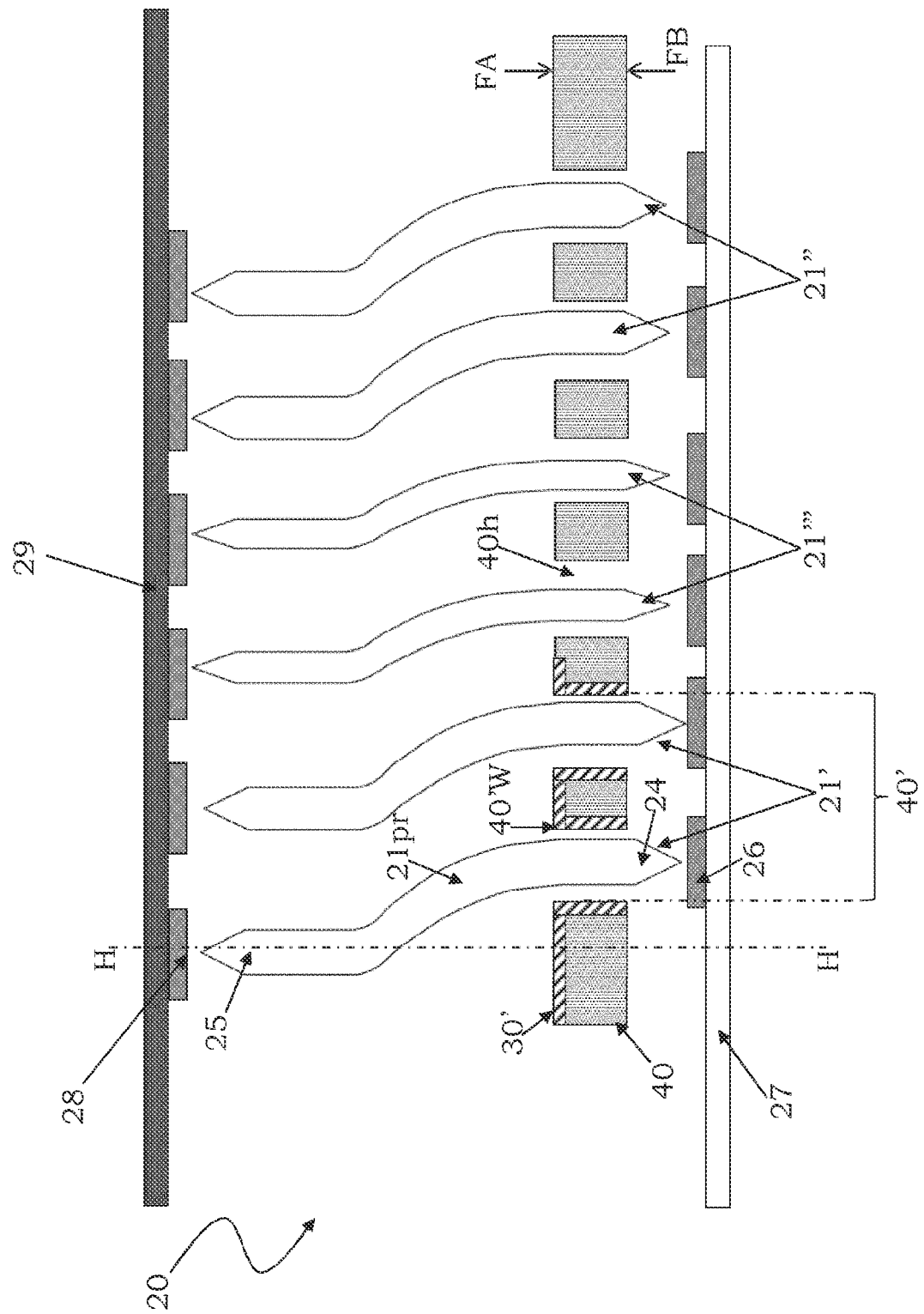

With reference to those figures, and in particular to the example of FIG. 2A, a testing head for testing electronic devices integrated on a semiconductor wafer according to the present disclosure is globally and schematically indicated with 20.

It is worth noting that the figures represent schematic views and are not drawn to scale, but instead they are drawn so as to emphasize the important features of the disclosure. Moreover, in the figures, the different elements are depicted in a schematic manner, their shape varying depending on the application desired. It is also noted that in the figures the same reference numbers refer to elements that are identical in shape or function. Finally, particular features described in relation to an embodiment illustrated in a figure are also applicable to the other embodiments illustrated in the other figures.

As shown in FIG. 2A, the testing head 20 comprises at least one guide 40 (a lower guide in the example of the figure) provided with a plurality of guide holes 40h apt to house a plurality of contact elements. In particular, the guide holes 40h are apt to house a plurality of first contact elements 21', which are apt to carry a first type of signal, a plurality of second contact elements 21", which are apt to carry a second type of signal, as well as a plurality of third contact elements 21''', which are apt to carry a third type of signal, as it will be described in greater detail hereinafter.

The guide 40 is made of a non-conductive material, for example a ceramic material such as silicon nitride, or of a glass or silicon-based material, or of a polyamide material, or of any other suitable dielectric material.

Generally, the testing head 20 is used to verify the operation of a device under which comprises at least one first region apt to receive power and ground signals, and a second region apt to receive/send input/output signals from/to a test equipment (not shown) connected to the testing head 20. In the first region, high current power signals, usually in the range of 1 A or higher, are handled, as well as ground signals, whereas in the second region operating signals, i.e., input/output signals having lower current values, usually in the range of 0.5 A or lower, are handled. For this reason, in the testing head 20 there are contact elements apt to carry power and ground signals and contact elements apt to carry input/output signals towards/from a device under test, those contact elements being distinct from each other and having different physical and mechanical characteristics.

At this regard, it is underlined that in the present disclosure the term "first contact elements" identifies the contact elements apt to carry ground signals (reference number 21'), the term "second contact elements" identifies the contact elements apt to carry power signals (reference number 21"), whereas the term "third contact elements" (reference number 21''') identifies the contact elements apt to carry operating signals, i.e., input/output signals between the test equipment and the device under test, wherein this distinction does not limit the scope of the present disclosure.

For example, in the case of contact elements in the form of probes formed by metal wires, in the manufacturing of the first and second contact elements 21' and 21" it is possible to use wires having different diameters, for example a larger diameter, compared to the diameter of the wires that form the third contact elements 21'''; it is possible to use also different materials for these different contact elements.

In the example of FIG. 2A, six contact elements are shown, in particular two first contact elements 21', two second contact elements 21" and two third contact elements 21''', but the number of those contact elements may obviously vary according to needs and/or circumstances, the figures being provided only for indicative purposes and not limiting the present disclosure.

Furthermore, again as a non-limiting example of the disclosure, FIG. 2A shows a testing head 20 wherein the contact elements are in the form of contact probes, preferably formed by metallic wires, having a body 21pr, which has a pre-deformation and is apt to further deform upon the pressing contact with the contact pads of a device under test, said contact probes being housed in the guide holes 40h, which are formed in the single guide 40, but the disclosure is not limited to this and the testing head 20 can comprise a lower guide, an intermediate guide, and an upper guide, as well as a different kind of contact elements, as it will be illustrated in detail hereinafter.

Each contact element of the testing head 20 therefore comprises the body 21pr, which extends along a longitudinal axis H-H between a first end portion or contact tip 24 and a second end portion or contact head 25.

More in particular, the contact tip 24 is apt to abut onto corresponding contact pads 26 of a device under test integrated in a semiconductor wafer 27.

Furthermore, in the illustrated example, the testing head 20 is a non-blocked-probe testing head and the contact elements terminate with the contact head 25 which is apt to abut onto corresponding contact pads 28 of an interposer or space transformer 29.

In particular, the space transformer 29 is apt to perform a spatial transformation of the distances between the pitches of the contact pads on opposite faces thereof, the space transformer 29 being generally connected to a printed circuit board or PCB (not shown), which is interfaced with the test equipment (also not shown).

Advantageously according to the present disclosure, the guide 40 comprises at least one first conductive portion 30' which includes a first group 40' of guide holes 40h. In other words, the first conductive portion 30' covers an area of the guide 40 which includes the first group 40' of the holes 40h, which are therefore formed at said area.

In particular, the guide holes of the first group 40' are electrically connected to each other by the first conductive portion 30' and house a corresponding group of contact elements, in particular a group of the first contact elements 21', and therefore house contact elements apt to carry ground signals towards the device under test. In this way, the first conductive portion 30' forms a common conductive plane, in particular a ground plane, for the first contact elements 21' housed in the guide holes of the first group 40', said first contact elements 21' being therefore electrically connected to each other by means of the ground plane, with which they are all in contact.

In other words, in the testing head 20, the first contact elements 21', which are short-circuited among each other and are housed in the first group 40' of the guide holes 40h, are apt to carry a same ground signal, resulting in the elimination of interferences on the operating signals and in an overall improvement of the frequency performance of the contact head 20.

As shown in FIG. 2A, the first conductive portion 30' is arranged on a superficial portion of the guide 40, in particular on a face FA thereof, said face FA being an upper face according to the local reference system of FIG. 2A. The first conductive portion 30' may also be arranged on a face FB, opposite the face FA, of the guide 40, said face FB being a lower face according to the local reference system of FIG. 2A, or it may be arranged on both the faces FA and FB.

In the embodiment of FIG. 2A, as previously described, the first contact elements 21' of the testing head 20 are contact probes having the body 21pr provided with a pre-deformation and apt to further deform itself during the contact with the contact pads 26 and 28 of the device under test and of the space transformer 29, respectively. In this case, the first conductive portion 30' preferably covers also at least one portion 40'W of an inner surface of each guide hole of the first group 40' of the guide holes 40h. More preferably, the internal surface of the guide holes of the first group 40' is entirely coated by the first conductive portion 30', the portion 40'W therefore coinciding with the entire inner surface of the holes. The electrical connection between the first contact probes 21' and the first conductive portion 30' is therefore achieved by means of a brushing contact between the body 21pr of the probes and the metallized portion 40'W of the guide holes into which the probes are housed.

However, it is underlined that also in the case in which the first conductive portion 30' does not coat the guide hole surface, the brushing contact is in any case guaranteed by the thickness of the first conductive portion 30' itself.

In an embodiment not shown in the figures, it is also possible to form the first conductive portion 30' in such a way that it is embedded in guide 40, in this way forming a ground plane which electrically connects the guide holes of the first group 40' within the guide 40. Obviously, such a first conductive portion 30' emerges at the inner surface of the guide holes in order to electrically contact the first contact probes 21'.

The presence of the first conductive portion 30', which allows to electrically connect at least one group of the first contact elements 21' apt to carry ground signals and therefore forming a common conductive (ground) plane, allows to eliminate the noise in the operating signals carried by the third contact elements 21''' inside the testing head 20.

In this way, the first conductive portion 30', by electrically connecting the holes of the first group 40' of the guide holes 40h to each other, short-circuits at least one corresponding group of the first contact elements 21', said group in particular being a group of ground contact elements.

Figure 2B:
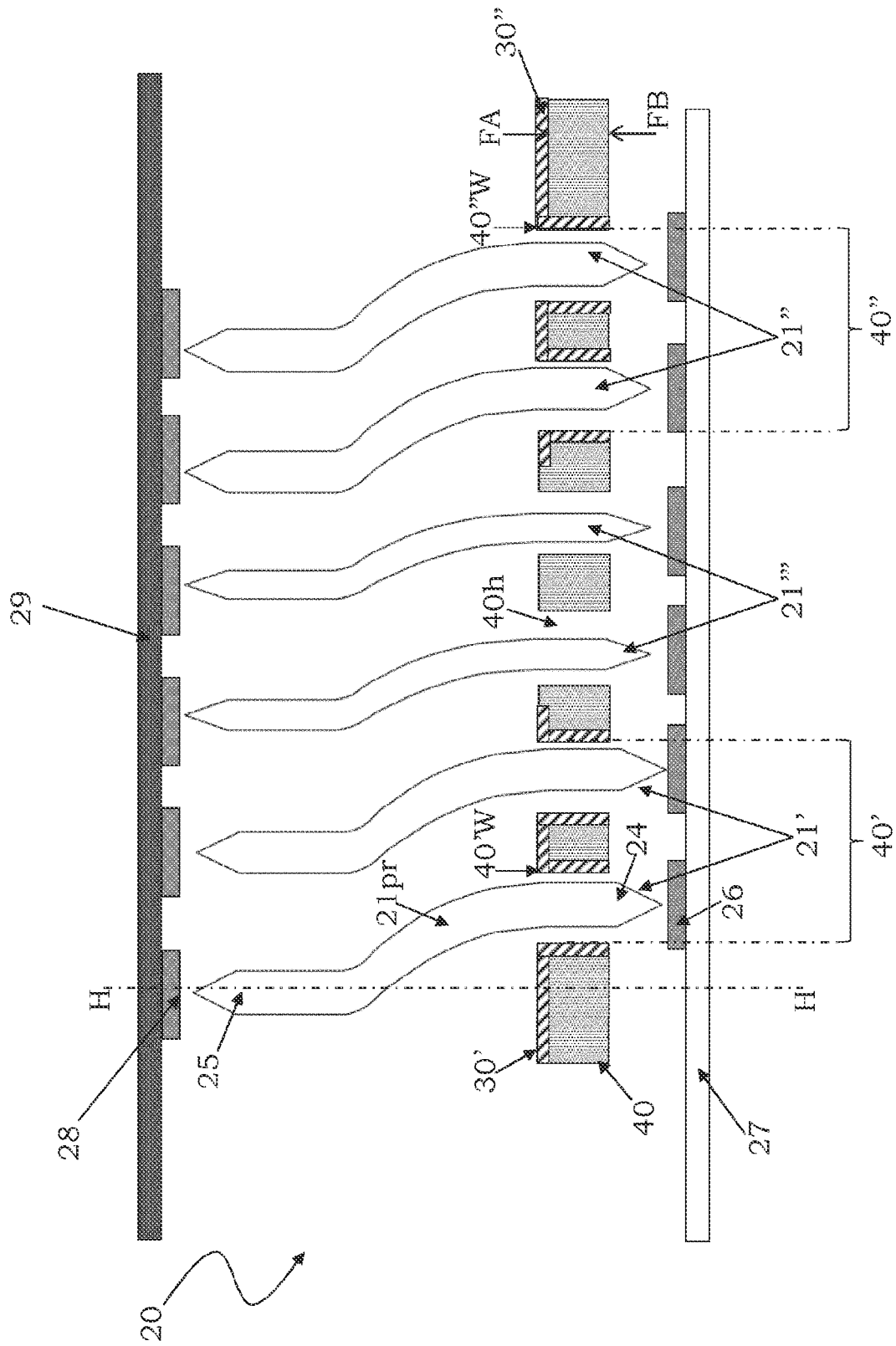

In order to further reduce the noise, it is preferable that also the second contact elements 21", apt to carry power signals, are electrically connected to each other, and as a consequence, in an embodiment represented in FIG. 2B, the guide 40 comprises at least one second conductive portion 30" which includes and electrically connects the holes of a second group 40" of the guide holes 40h to each other, wherein a corresponding group of the second contact elements 21" is housed in the second group 40", the second conductive portion 30" being physically separated from the first conductive portion 30' and therefore not electrically connected thereto. In this case, the second contact elements 21" connected by the second conductive portion 30", i.e., housed in the second group 40" of the guide holes 40h, are apt to carry power signals and the second conductive portion 30" also forms a common conductive plane, in particular a power plane.

In this way, in the testing head 20, the second contact elements 21" housed in the second group 40" of the guide holes 40h are short-circuited to each other and are apt to carry a same power signal.

As illustrated for the first conductive portion 30', the second conductive portion 30" is arranged on a superficial portion of guide 40 too, i.e., it is arranged on the face FA and/or on the face FB of the guide 40. Furthermore, also the second conductive portion 30" coats at least one portion 40"W of an inner surface of each guide hole of the second group 40" of the guide holes 40h (preferably the entire surface), the electrical connection between the second contact elements 21" and the second conductive portion 30"

being guaranteed by the brushing contact between the body 21pr of the second contact elements 21" and the portion 40"W coated by a conductive material (metallized).

It is appropriate to observe again that, in its more general form, the testing head 20 comprises contact elements apt to carry ground and power signals, as well as contact elements apt to carry operating signals, housed in the guides according to any kind of combination, the conductive portions being appropriately shaped so as to short-circuit even non-adjacent guide holes.

In an embodiment of the present disclosure shown in FIG. 2C, the guide 40 further comprises at least one third conductive portion 30''' which includes and electrically connects the holes of a third group 40''' of the guide holes 40h to each other, wherein a corresponding group of the third contact elements 21''' is housed in the third group 40''', the third conductive portion 30''' being physically separated from the first conductive portion 30' and from the second conductive portion 30" and therefore not electrically connected thereto. In this case, the third contact elements 21''' connected by the third conductive portion 30''', i.e., housed in the third group 40''' of the guide holes 40h, are apt to carry operating signals, that is input/output signals between the device under test and the test equipment, and also the third conductive portion 30''' forms on a common conductive plane, in particular a signal plane.

In this way, in the testing head 20, the third contact elements 21''' housed in the third group 40''' of the guide holes 40h are short-circuited to each other and are apt to carry a same operating signal, that is a same input/output signal between the device under test and the test equipment.

The embodiment of FIG. 2C is particularly advantageous in case of a necessity of short-circuiting two or more contact pads of the device under test, since it is possible to establish a loop-back configuration while considerably shortening the path of the signals, which do not pass through the entire contact element towards/from the test equipment but stop at the common conductive signal plane, with consequent advantages in terms of frequency performance of the testing head 20.

As illustrated for the first conductive portion 30' and the second conductive portion 30", the third conductive portion 30''' is arranged on a superficial portion of guide 40, that is it is arranged on the face FA and/or the face FB of guide 40. Furthermore, the third conductive portion 30''' coats at least one portion 40'''W of an inner surface of each guide hole of the third group 40''' of the guide holes 40h (preferably the entire surface), the electrical connection between the third contact elements 21''' and the third conductive portion 30''' being guaranteed by the brushing contact between the body 21pr of the third contact elements 21''' and the portion 40'''W coated with conductive material (metallized).

The conductive portions 30', 30" and 30''' are made of a metallic material for example selected from copper (Cu), silver (Ag), gold (Au), palladium (Pd), rhodium (Rh) and alloys thereof.

Obviously, even if not shown in the figures, it is possible to provide a configuration in which only the first conductive portion 30' is present, a configuration in which only the second conductive portion 30" is present, or a configuration in which only the third conductive portion 30''' is present, or any combination thereof.

FIG. 3A shows a top view of guide 40, in particular of the face FA thereof, wherein the first conductive portion 30' electrically connects the holes of the first group 40' of the guide holes 40h, the first group 40' being apt to house a corresponding group of the first contact elements 21' which carry ground signals, whereas FIG. 3B shows a top view of the guide 40, still of the face FA thereof, wherein, in addition to the first conductive portion 30', also the second conductive portion 30" is formed, which electrically connects the holes of the second group 40" of the guide holes 40h, the second group 40" being apt to house a corresponding group of the second contact elements 21" which carry power signals, and is physically and electrically separated from the first conductive portion 30' by a non-conductive zone 31 of guide 40. Similarly, FIG. 3C shows a top view of guide 40, still of the face FA thereof, wherein, in addition to the first conductive portion 30' and to the second conductive portion 30", also the third conductive portion 30''' is formed, which electrically connects the holes of the third group 40''' of the guide holes 40h, the third group 40''' being apt to house a corresponding group of the third contact elements 21''' which carry input/output signals, and is physically and electrically separated from the conductive portions 30' and 30" by the non-conductive zone 31 of guide 40.

It is observed that the first conductive portion 30', the second conductive portion 30", and the third conductive portion 30''' only coat a superficial portion of guide 40, in particular only a portion of its face FA and/or its face FB, namely the first, the second and the third conductive portion 30', 30", 30''' do not extend over the entire area of the face FA and/or FB, so as to prevent contact elements that are not meant to be short-circuited from being short-circuited to each other. In other words, the conductive portions 30', 30", 30''' have an area that is less than an area of the face of the guide on which they are formed.

The guide 40 is therefore not entirely coated by the conductive portions 30', 30" and 30''', and at least the non-conductive zone 31, which separates the conductive portions, is present, the guide holes housing contact elements not meant to be short-circuited being formed in such a non-conductive zone 31.

Alternatively, in a further embodiment of the present disclosure shown in FIG. 3D, the first conductive portion 30' covers a face of the guide 40 (the face FA in the example), except for areas where guide holes apt to house contact elements that must not be short-circuited are formed. In other words, the first conductive portion 30' is not formed in areas where the guide holes that do not belong to group 40' are formed. In this case, the non-conductive zone 31 is therefore formed only at the guide holes that do not belong to the first group 40'. It is underlined that, in this case, the non-conductive zone 31 may also be in the form of a plurality of non-conductive zones, each formed only at a guide hole that has to be electrically insulated. The same configuration can be adopted also for the second conductive portion 30" and for the third conductive portion 30'''.

At this regard, it is possible to provide that the non-conductive zone 31 is covered by at least one added portion of dielectric material or coating dielectric portion arranged on guide 40, so as to avoid the presence of grooves in guide 40, for example between different conductive portions or at guide holes that don't have to be metallized, where metallic debris produced by the brushing contact of the contact elements with the walls of the guide holes may settle. In other words, the coating dielectric portion, which preferably has a thickness that is substantially equal to that of the conductive portions, coats the non-conductive zones 31 preventing metallic debris from settling therein, so as to avoid leakage and undesired electrical connections between contact elements apt to carry a different kind of signal.

It is also possible that all the contact elements that carry a same kind of signal (for example all the input/output contact elements or all the ground or power contact elements) are electrically connected by means of one of the conductive portions 30', 30" and 30''', or that only some of them are connected by one of the conductive portions 30', 30" and 30'''.

Figure 4A:
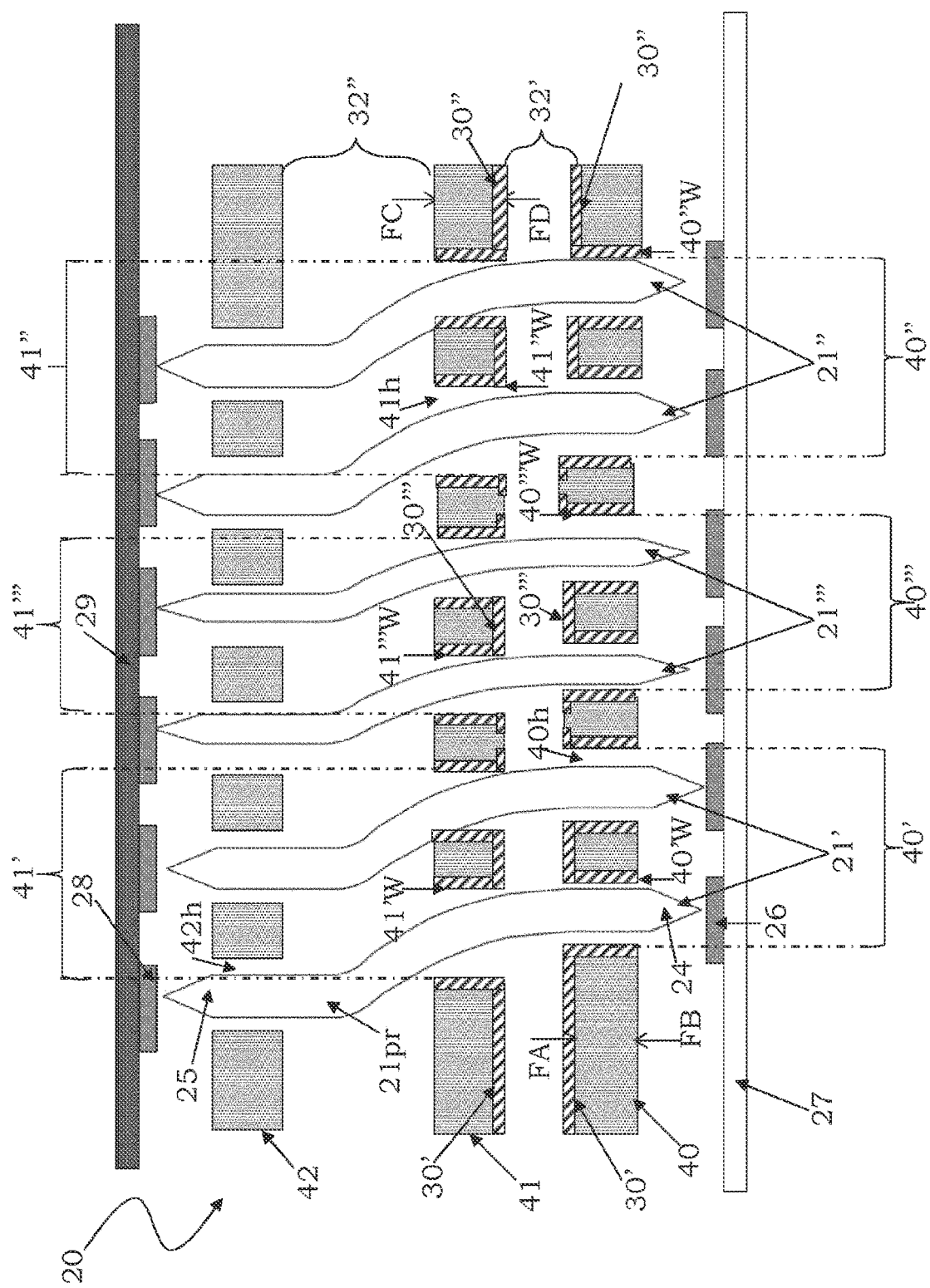
FIGS. 4A and 4B schematically show a testing head according to further alternative embodiments of the present disclosure.

Furthermore, according to an alternative embodiment shown in FIG. 4A, the testing head 20 comprises at least one lower guide, still indicated with 40, at least one intermediate guide 41, and at least one upper guide 42. The lower guide 40 and the intermediate guide 41 are separated from each other by a suitable first gap 32', whereas the intermediate guide 41 and the upper guide 42 are separated from each other by a suitable second gap 32".

It is preferable to form the conductive portions 30', 30" and 30''' in the lower guide 40 and/or in the intermediate guide 41 of the testing head 20, since in this way the conductive portions 30', 30" and 30''' are closer to the device under test.

In the embodiment of FIG. 4A, the intermediate guide 41 is provided with a plurality of guide holes 41h, apt to house the contact elements 21', 21" and 21'''.

Similarly, the upper guide 42 is provided with a plurality of guide holes 42h, apt to house the contact elements 21', 21" and 21'''.

Conveniently, also the intermediate guide 41 may comprise the first conductive portion 30', which includes and electrically connects the holes of a first group 41' of the guide holes 41h to each other, said first group 41' housing a corresponding group of the first contact elements 21', which carry ground signals. Furthermore, the intermediate guide 41 may also comprise the second conductive portion 30", which includes and electrically connects the holes of a second group 41" of guide holes 41h to each other, said second group 41" housing a correspondent group of the second contact elements 21", which carry power signals.

Similarly, also the intermediate guide 41 may comprise the third conductive portion 30''', which includes and electrically connects the holes of a third group 41''' of the guide holes 41h, said third group 41''' housing a corresponding group of the third contact elements 21''', which carry input/output signals.

In the example of FIG. 4A, which is provided for indicative purposes only and does not limit the scope of present disclosure, the first conductive portion 30' is arranged on a superficial portion of the intermediate guide 41, in particular on a face FD thereof, said face FD being a lower face according to local reference system of FIG. 4A. The first conductive portion 30' may also be arranged on a face FC, opposite to the face FD, of the intermediate guide 41, said face FC being an upper face according to local reference system of FIG. 4A, or it may be arranged on both faces FC and FD. The conductive portions 30" and 30''' may be formed analogously.

As already observed for the lower guide 40, the conductive portions 30', 30" and 30''' only cover a superficial portion of the intermediate guide 41 as well, in particular only a portion of its face FC and/or its face FD, namely the conductive portions 30', 30" and 30''' do not extend over the entire area of the face FC and/or FD and therefore do not extend over the entire area of the intermediate guide 41.

Furthermore, in the example of FIG. 4A, the testing head 20 is manufactured according to the so-called "shifted plate technology", wherein the contact elements 21', 21" and 21''', are "buckling beam" contact probes and are initially formed straight, the relative shift of the guides causing a deformation of the probe body, as well as the desired retention of the probes itself thanks to the friction with the walls of the guide holes into which they slide.

In this case, as previously observed for the lower guide 40, also in the intermediate guide 41 the first conductive portion 30' coats at least one portion 41'W of an inner surface of each guide hole of the first group 41' of the guide holes 41h, the second conductive portion 30" coats at least one portion 41"W of an inner surface of each guide hole of the second group 41" of the guide holes 41h, and the third conductive portion 30''' coats at least one portion 41'''W of an inner surface of each guide hole of the third group 41''' of guide holes 41h, the electrical connection between the contact probes 21', 21" and 21''' and the conductive portions 30', 30" and 30''' being established by means of a brushing contact between the body 21pr of the contact probes and the metallized portions 41'W, 41"W and 41'''W, respectively.

It is possible to provide a configuration wherein only one between the lower guide 40 and the intermediate guide 41 comprises the first conductive portion 30' and/or the second conductive portion 30", or it is also possible to provide a configuration wherein both the lower guide 40 and the intermediate guide 41 comprise the first conductive portion 30' and/or the second conductive portion 30".

FIG. 4A shows as an example an embodiment wherein both the lower guide 40 and the intermediate guide 41 comprise both the first conductive portion 30' and the second conductive portion 30". This embodiment also increases the possibility of a brushing contact between the contact probes and the conductive portions 30' and 30" and possibly the metallized portions 41'W and 41"W.

Still referring to FIG. 4A, it is possible to provide a configuration wherein both the intermediate guide 41 and the lower guide 40 comprise the third conductive portion 30'''. Alternatively, it is possible to provide a configuration wherein only one between the intermediate guide 41 and the lower guide 40 comprises the third conductive portion 30''' which short-circuits input/output signal contact elements, preferably the lower guide 40.

Figure 4B:
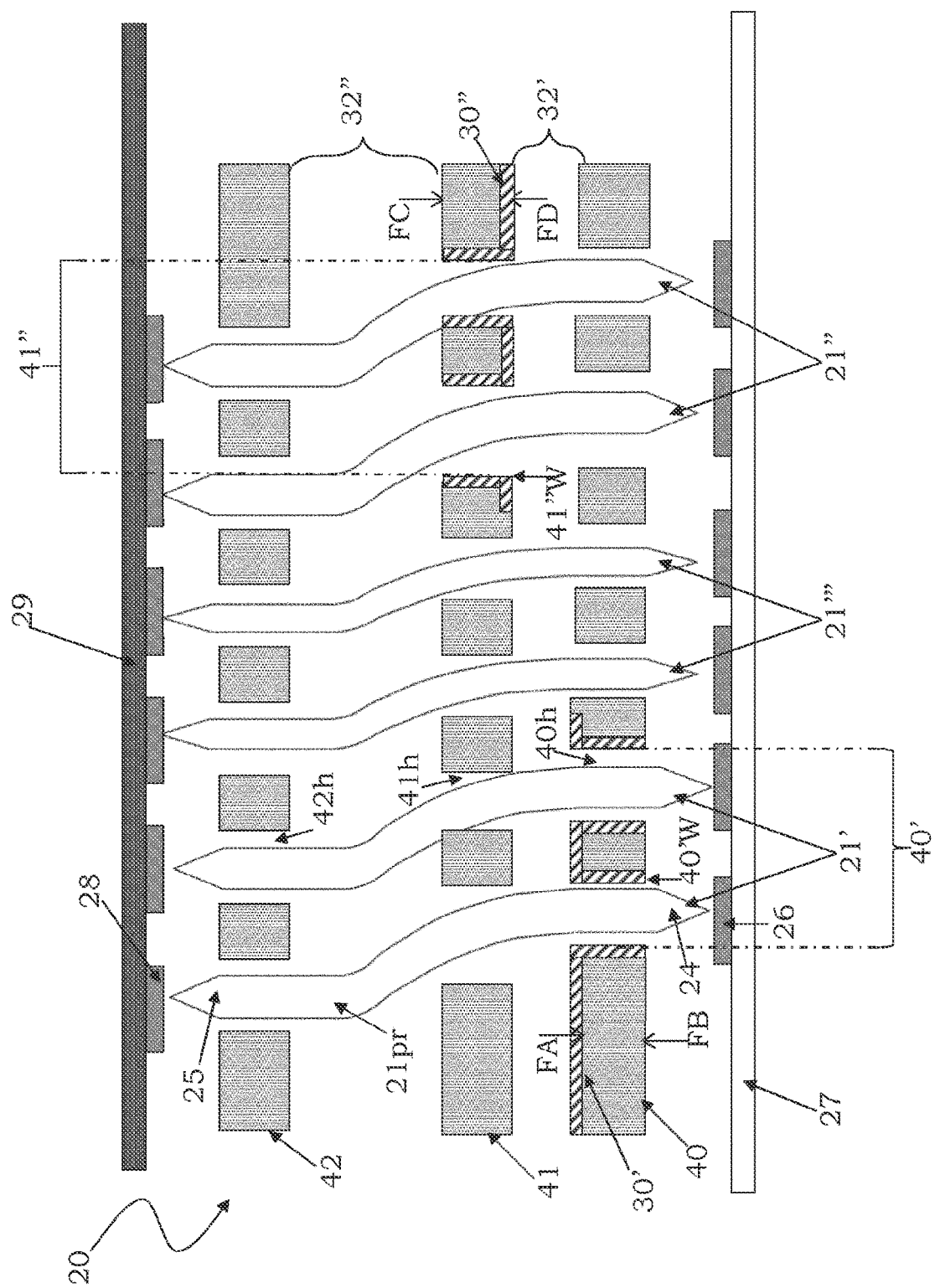

In another embodiment, schematically shown in FIG. 4B, the first conductive portion 30' is formed on one between the lower guide 40 and the intermediate guide 41, in particular the lower guide 40, and the second conductive portion 30" is formed on the other between the lower guide 40 and the intermediate guide 41, in particular the intermediate guide 41, in the illustrated example on two faces thereof facing each other, in particular the upper face FA of the lower guide 40 and the lower face FD of the intermediate guide 41, according to the local reference system of FIG. 4B. Obviously, in this embodiment as well one between the two guides 40 and 41, preferably the lower guide 40, may comprise the third conductive portion 30'''. This embodiment simplifies the formation of the conductive portions 30', 30", 30''' on different guides.

Obviously, for both the embodiment of FIG. 4A and the embodiment of FIG. 4B, it is possible to provide that also the upper guide 42 comprises the first conductive portion 30' and/or the second conductive portion 30" and/or the third conductive portion 30''', as well as it is also possible to provide a configuration wherein the intermediate guide 41 is not present but only the upper guide 42, on which the first conductive portion 30' and/or the second conductive portion 30" and/or the third conductive portion 30''' can be formed, is present.

In another embodiment of the present disclosure, shown in FIGS. 5A and 5B, a same guide, in particular the lower guide 40 in the example of the figures, comprises the first conductive portion 30', which is formed on the face FA, and comprises the second conductive portion 30", which is formed on the opposite face FB. Analogous considerations can be made for the intermediate guide 41 and the faces FC and FD on which the first and/or second conductive portions 30' and 30" can be formed, and also for the upper guide 42.

It is observed that this embodiment, wherein the first conductive portion 30' and the second conductive portion 30" are formed on two opposite faces of the same guide, is particularly advantageous, since, as schematically shown in FIG. 5B, in many cases the first contact elements 21' (apt to carry ground signals) and the second contact elements 21" (apt to carry power signals) are very close to each other in the testing head 20, for example alternated one after the other, and for this reason it is complicated to form both conductive portions 30' and 30" on a same face of a guide of the testing head 20. In other words, in this embodiment, one of the first and second conductive portions 30' or 30" is apt to electrically connect the first contact elements 21' (apt to carry ground signals), whereas the other conductive portion, formed on an opposite face of the same guide, is apt to electrically connect the second contact elements 21" (apt to carry power signals), in particular alternated with the first contact elements 21', in this way simplifying the production of the testing head 20 and avoiding complicated interlacement of conductive portions. If the first contact elements 21' apt to carry ground signals and the second contact elements 21" apt to carry power signals are alternated one after the other, both the conductive portions 30' and 30" are locally interrupted by suitable non-conductive zones 31' and 31" (similarly to what observed in relation to FIGS. 3A-3D), respectively, so as to avoid an electrical connection between ground contact elements and power contact elements. The non-conductive zones 31' and 31" therefore locally prevent an electrical connection between adjacent contact elements apt to carry different signals.

Obviously, even if not shown in FIGS. 5A and 5B, in this embodiment it is also possible to provide the presence, on one of the two faces of the guide, or even on both faces, of the third conductive portion 30''', the latter also possibly interrupted by suitable non-conductive zones if the third contact elements 21''' are very close, for example alternated, to the first contact elements 21' and/or the second contact elements 21".

Figure 6:
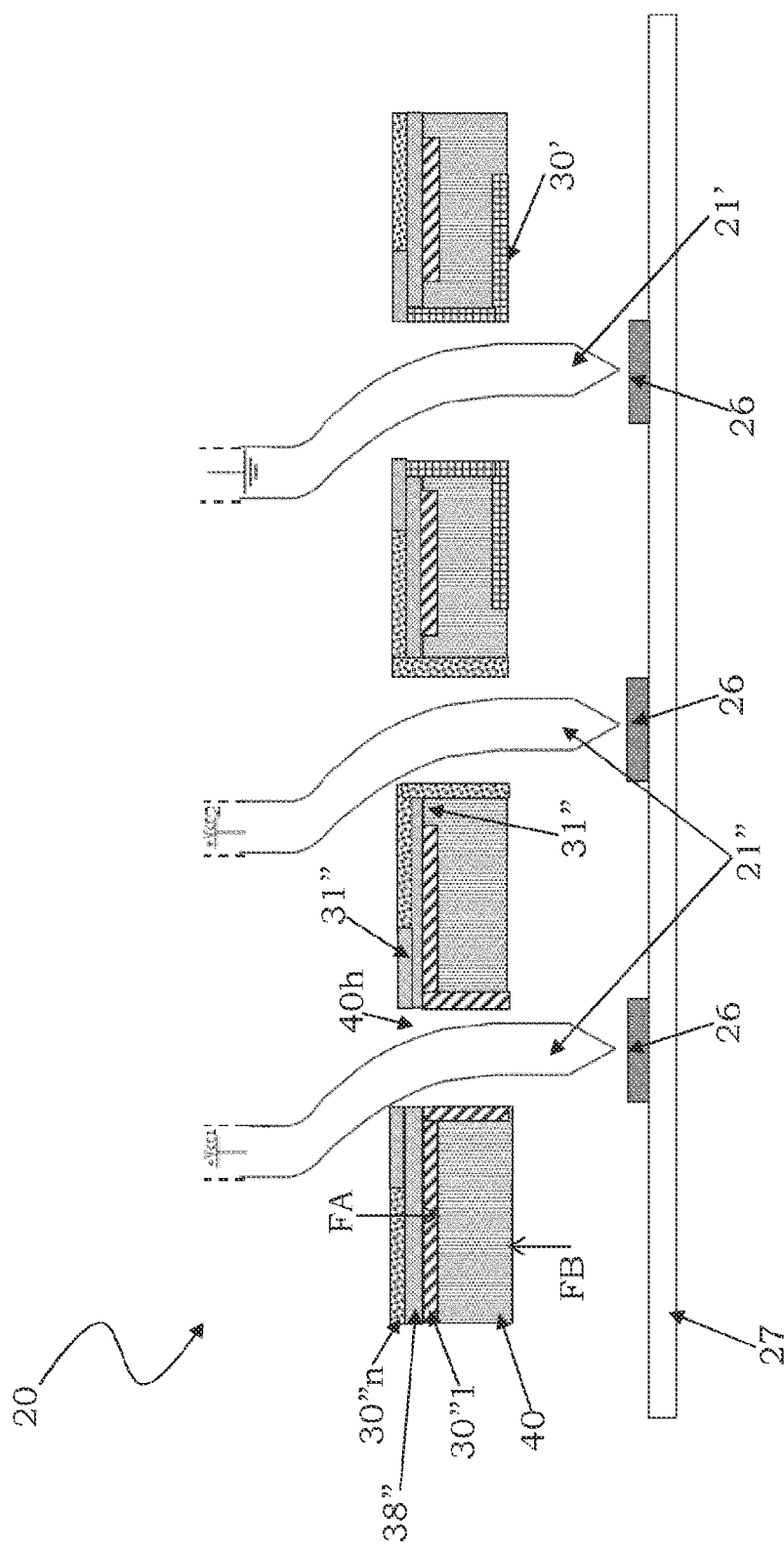
FIG. 6 schematically shows a portion of a testing head according to yet another alternative embodiment of the present disclosure.

According to a further alternative embodiment of the present disclosure illustrated in FIG. 6, one or more of the conductive portions 30', 30" and 30''' (the second conductive portion 30" in FIG. 6) comprises a plurality of conductive portions that are overlapped and electrically insulated from each other, said conductive portions being identified with the reference number 30"1-30"n in FIG. 6. In this case, a first layer 30"1 is formed on the face FA of guide 40, and the subsequent layers are formed starting from the first layer 30"1, consecutive conductive layers being separated from each other by a non-conductive layer 38". In this way, different conductive layers may form common conductive plans for different power (or ground or signal) domains, if needed by a particular application.

As an example, if the testing head 20 has to carry a plurality of different power signals (indicated in FIG. 6 as Vcc1 and Vcc2), in this embodiment the face FA of the guide 40 comprises a corresponding number of layers 30"1-30"n of the second conductive portion 30", each layer being apt to electrically connect the respective second contact elements 21" apt to carry a single specific power signal. Furthermore, the other face of the guide, in the example the face FB, can be covered by the first conductive portion 30', which electrically connects the contact elements 21' apt to carry ground signals. In this case too, each conductive layer may be locally interrupted by suitable non-conductive zones 31" in order to not electrically connect contact elements that must not be short-circuited to each other. In particular, the non-conductive zones 31" of a layer are formed at the holes housing contact elements that must not be short-circuited by said layer, whereas said layer covers at least partially the walls of the guide holes housing contact elements that must be short-circuited by it.

The conductive portions 30', 30" and 30''' may therefore be more than one, as there can be more than one power, ground and signal domains (the latter occurs when different groups of pads of the device under test need to be short-circuited), and possibly may be arranged on different levels if required.

As observed before, in FIGS. 2A-2C, 4A-4B, 5A-5B and 6, the contact elements 21', 21" and 21''' are contact probes of the "buckling beam" type.

Figure 7:
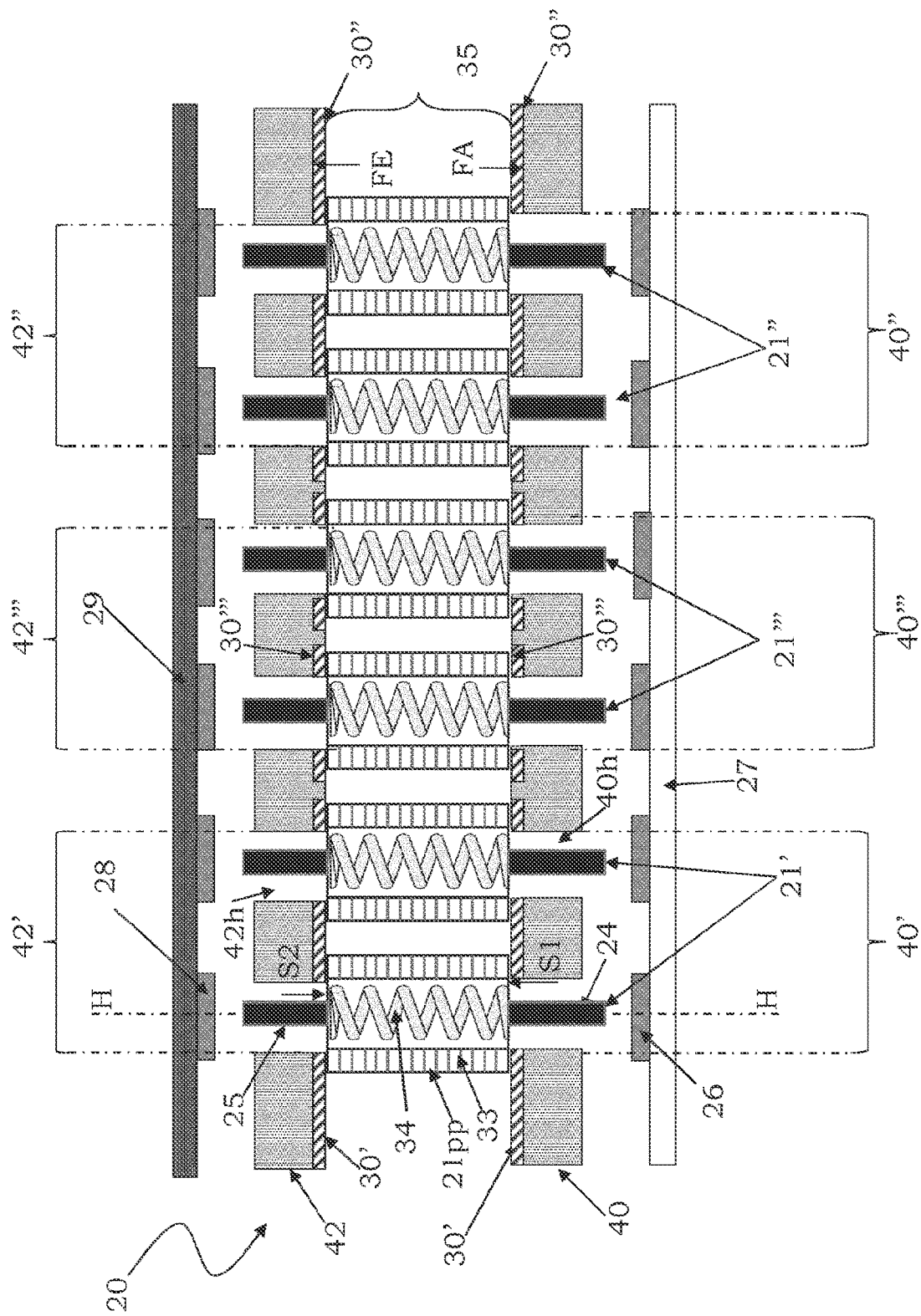
FIG. 7 schematically shows a testing head according to an alternative embodiment of the present disclosure, wherein contact elements are in the form of pogo pins.

In a further alternative embodiment of the present disclosure, shown in FIG. 7, the contact elements of testing head 20 are in the form of pogo pins. In this embodiment, the testing head 20 comprises the lower guide 40 and the upper guide 42 and does not comprise the intermediate guide 41.

In particular, each contact element 21', 21" and 21''' comprises a body 21pp that includes a casing 33 and an elastic member 34 arranged inside the casing 33. A first end of the elastic member 34 is connected to a first end portion or contact tip 24 of the pogo pin, whereas a second end of the elastic element 34, opposite the first end, is connected to a second end portion or contact head 25 of the pogo pin. The contact tip 24, which is inserted into guide holes 40h formed in the lower guide 40, is apt to abut onto contact pads 26 of a device under test integrated on a wafer 27, whereas the contact head 25, which is inserted into guide holes 42h formed in the upper guide 42, is apt to abut onto contact pads 28 of a space transformer 29, the lower guide 40 and the upper guide 42 being separated by a gap 35.

The casing 33 of each pogo pin preferably has a cylindrical shape, but obviously other shapes are also possible.

Conveniently, the lower guide 40 and/or the upper guide 42 comprises the first conductive portion 30', which includes and electrically connects the holes of a first group 40' of the guide holes 40h to each other, and/or the holes of a first group 42' of guide holes 42h. Obviously, the lower guide 40 and/or the upper guide 42 may also comprise the second conductive portion 30", which includes and electrically connects the holes of a second group 40" of the guide holes 40h to each other, and/or the holes a second group 42" of guide holes 42h. The lower guide 40 and/or the upper guide 42 may also comprise the third conductive portion 30''', which includes and electrically connects the holes of a third group 40''' of guide holes 40h to each other, and/or the holes of a third group 42''' of the guide holes 42h, the third conductive portion 30''' being preferably formed on the lower guide 40.

The guide holes of the first group 40' and/or of the first group 42' house first contact elements or pogo pins 21' apt to carry ground signals, the guide holes of the second group 40" and/or of the second group 42" house second contact elements or pogo pins 21" apt to carry power signals, whereas the guide holes of the third group 40''' and/or the third group 42''' house third contact elements or pogo pin 21''' apt to carry input/output signals between the device under test and the test equipment.

The casing 33 of the body 21pp of each pogo pin is shaped so as to define a first surface S1 and a second surface S2, arranged at opposite ends of the casing 33 along a longitudinal axis H-H thereof, which surfaces S1 and S2 are apt to abut onto the lower guide 40 and the upper guide 42, respectively, the casing 33 of the pogo pins having a maximum cross-sectional size (generally around 80 µm) that is greater than a diameter of the guide holes, the term diameter indicating a maximum cross-sectional size of the guide holes, even of non-circular section.

The contact tip 24 and the contact head 25 are electrically connected to the casing 33 of the pogo pins, said casing 33 being made of a conductive material.

In this way, the pressing contact between the casing 33, in particular between the surfaces S1 and S2 thereof, and the first conductive portion 30' ensures the electrical connection between the first pogo pins 21' housed in the first group 40' and 42' of guide holes of the lower guide 40 and the upper guide 42, respectively, said pogo pins being apt to carry ground signals, while the pressing contact between the casing 33, in particular between the surfaces S1 and S2 thereof, and the second conductive portion 30" ensures the electrical connection between the second pogo pins 21" housed in the second group 40" and 42" of guide holes of the lower and upper guide 40 and 42, respectively, said pogo pins being apt to carry power signals. Similarly, the pressing contact between the casing 33, in particular between the surfaces S1 and S2 thereof, and the third conductive portion 30''' ensures the electrical connection between the third pogo pins 21''' housed in the third group 40''' and 42''' of guide holes of the lower and upper guides 40 and 42, respectively, said pogo pins being apt to carry input/output operating signals.

In other words, the electrical connection between the pogo pins 21', 21" and 21''' and the conductive portions 30', 30" and 30''', respectively, is in this case performed by means of a pressing contact of the first surface S1 and the second surface S2 of the casing 33 on the lower guide 40 and on the upper guide 42, respectively, the conductive portions being formed on a superficial portion of the lower guide 40, in particular on a face FA thereof, said face FA being an upper face according to the local reference system of FIG. 7, and/or on a face FE of the upper guide 42, said face FE being a lower face, still according to local reference system of FIG. 7.

The use of pogo pins as contact elements is particularly advantageous because in this case it is not necessary to guarantee a brushing contact between the contact elements and the inner surface of the guide holes, a pressing contact between the casing 33, in particular between the surfaces S1 and S2 thereof, and the guides being sufficient to ensure the proper electrical connection between the conductive portions and the contact elements, wherein suitable groups of those contact elements are in this way electrically connected (short-circuited) to each other.

Figures 8A, 8B, 8C:
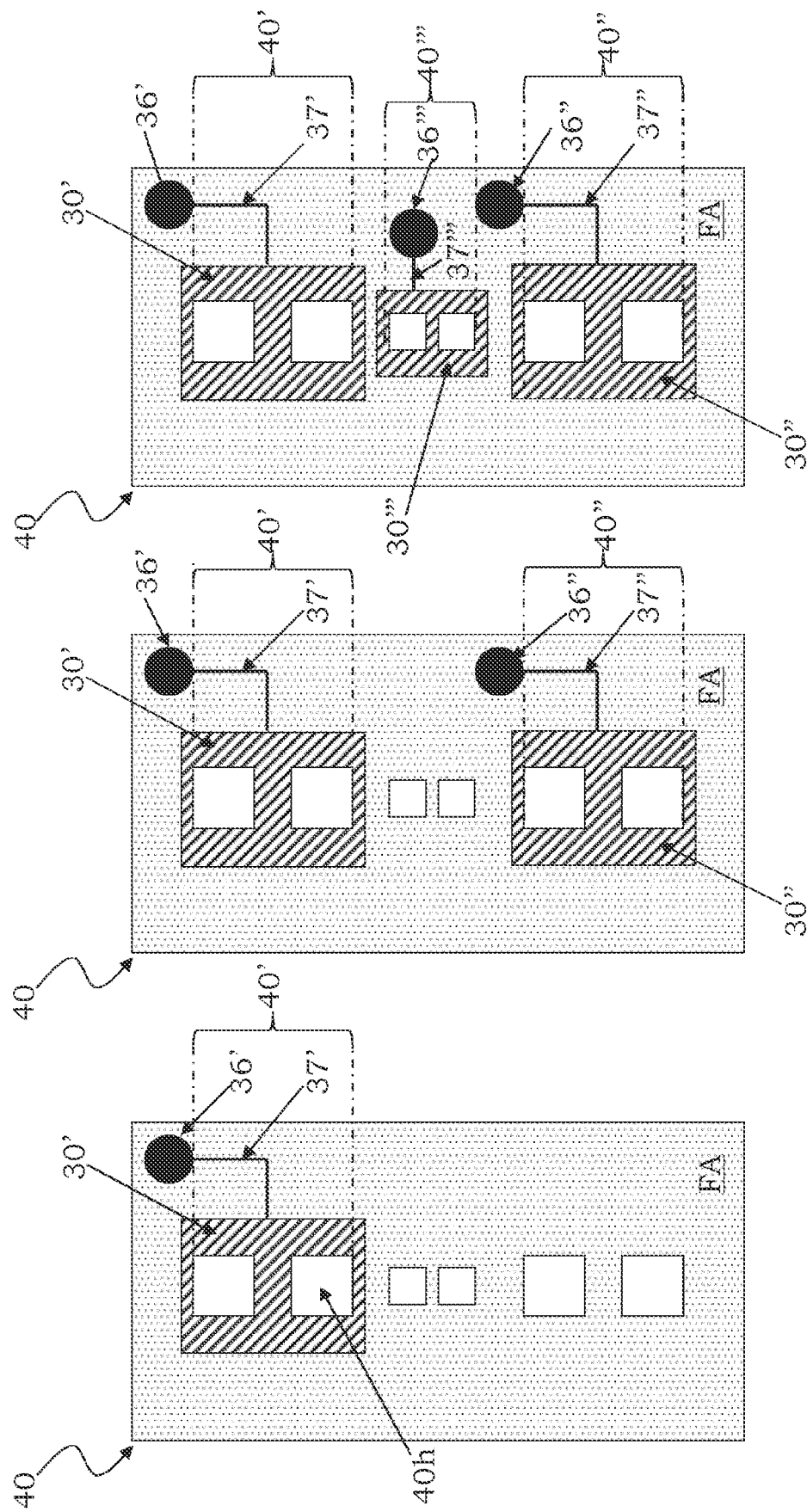
FIGS. 8A-8C schematically show top views of a guide of a testing head according to further alternative embodiments of the present disclosure.

According to a further embodiment of the present disclosure, shown in FIG. 8A, the lower guide 40, which comprises the first conductive portion 30', comprises at least one first common pad 36' connected to the first conductive portion 30' by means of a first conductive track 37'. In this way, the first contact elements 21' apt to carry ground signals are connected to the first common pad 36' by means of the first conductive track 37', the first common pad 36' therefore being a common ground pad. Even if FIG. 8A only shows the lower guide 40, also the intermediate guide 41 and/or the upper guide 42 may comprise a first common pad and a respective first conductive track.

The common pad 36' may be connected by means of a first connection wire to a housing (not shown) of the testing head 20.

Furthermore, as shown in FIG. 8B, the lower guide 40 and/or the intermediate guide 41 and/or the upper guide 42 (the lower guide 40 in the figure) may comprise at least one second common pad 36" connected to the second conductive portion 30" by means of a second conductive track 37". In this way, the second contact elements 21" apt to carry power signals are connected to the second common pad 36" by means of the second conductive track 37", the second common pad 36" therefore being a common power pad.

As shown in FIG. 8C, the lower guide 40 and/or the intermediate guide 41 and/or the upper guide 42 (the lower guide 40 in the figure) may also comprise at least one third common pad 36''' connected to the third conductive portion 30''' by means of a third conductive track 37'''. In this way, the third contact elements 21''' apt to carry input/output operating signals are connected to the third common pad 36''' by means of the third conductive track 37''', the third common pad 36''' therefore being a common signal pad.

The presence of a common pad 36', 36", 36''' connected to the respective conductive portion 30', 30", 30''' allows to extract a respective signal from the testing head 20 and to connect it, for example, to a PCB connected to the testing head 20. The common pad therefore can carry a monitoring signal, for example of the voltage levels on the corresponding guide.

Figure 9B:
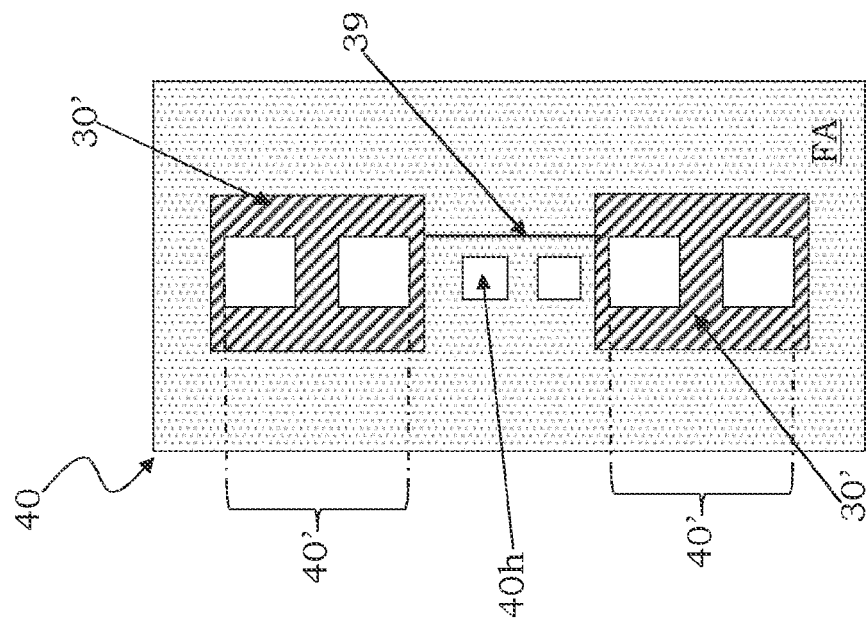
FIGS. 9A and 9B schematically show top views of a guide of a testing head according to further alternative embodiments of the present disclosure.
Figure 9A:
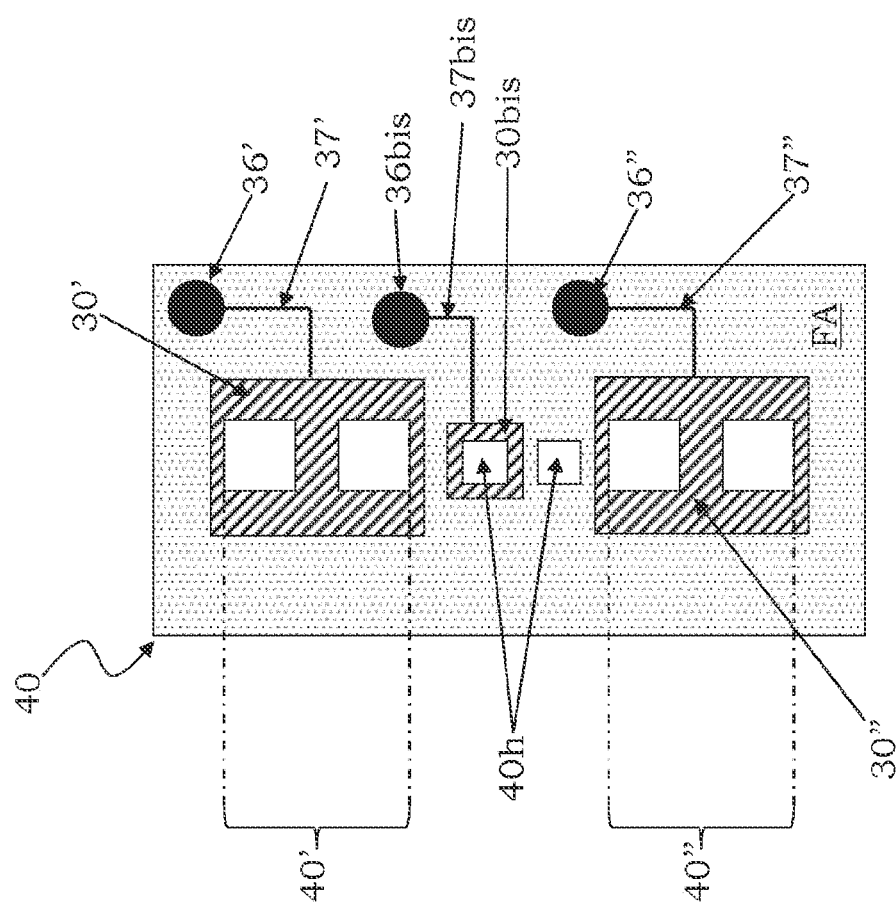

As shown in FIG. 9A, it is also possible to provide the presence on a guide of a further conductive portion 30bis added to the conductive portions 30', 30" and 30''', the further conductive portion 30bis including and metallizing a single guide hole 40h, preferably housing a third contact element 21''' which carries input/output signals. In this case, the guide also comprises a further common pad 36bis connected to the further conductive portion 30bis by means of a further conductive track 37bis. In this way, the third contact element 21''' housed in such a metallized hole is electrically connected to the further common pad 36bis by means of the further conductive track 37bis, so that it is possible for example to transport an input/output signal from the further common pad 36bis towards a PCB. It is also possible to provide the presence of a plurality of further conductive portions, separated from each other, each performing the metallization of a respective single guide hole 40h, such further conductive portions being possibly connected to each other by means of conductive tracks or by means of circuit components if needed.

Furthermore, according to an alternative embodiment of the present disclosure shown in FIG. 9B, it is possible to provide that at least two conductive portions (two first conductive portions 30' in FIG. 9B, but not limited to these) of the guide 40 are electrically connected to each other by means of a conductive track 39 in the guide, so as to be able to electrically connect to each other groups of contact elements apt to carry a same type of signal but that are housed in respective groups of guide holes distanced from each other in the guide (two groups 40' in FIG. 9B but not limited to these).

Figure 10B:
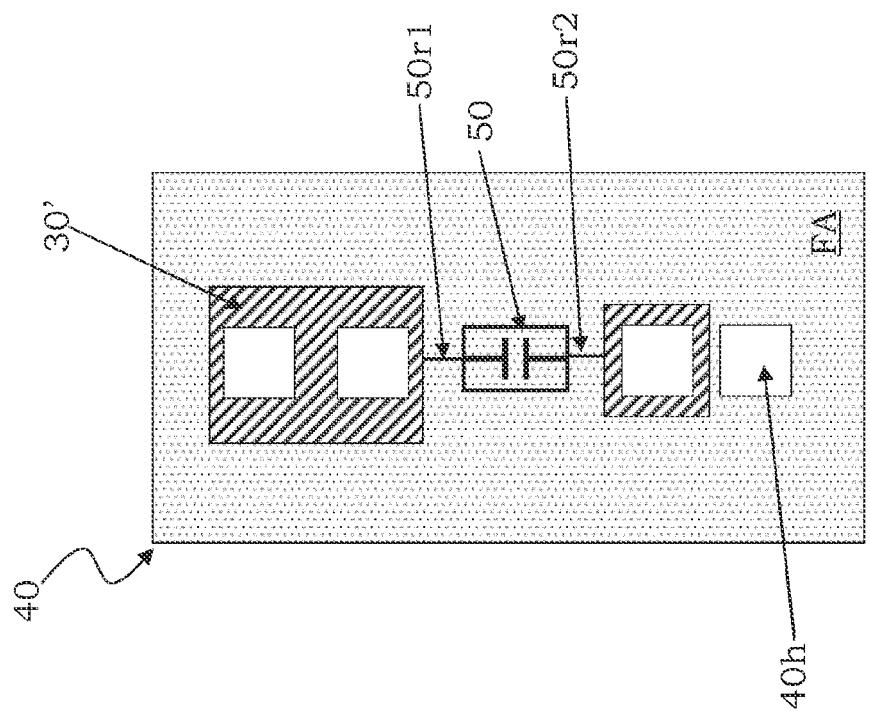
FIGS. 10A and 10B schematically show top views of a guide of a testing head according to yet further alternative embodiments of the present disclosure.
Figure 10A:
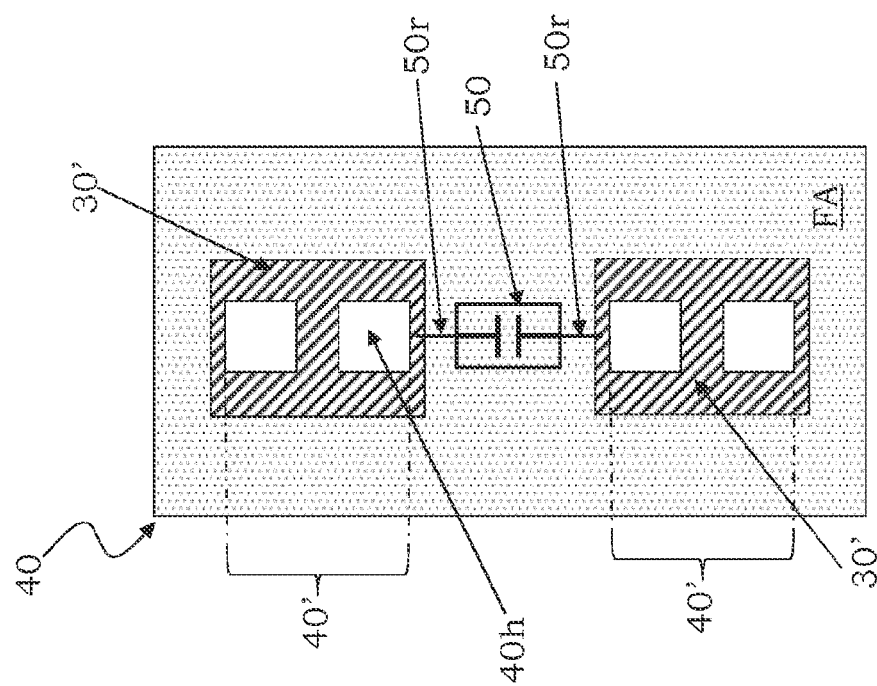

Finally, according to an embodiment shown in FIGS. 10A and 10B, the guide 40, which comprises at least one conductive portion (the conductive portion 30' in the figures but not limited thereto), also comprises at least one circuit component 50 connected to the conductive portion, which forms a common conductive plane.

In particular, in the example of FIG. 10A, the guide 40 comprises at least two conductive portions (two first conductive portions 30' in the figure but not limited thereto), the circuit component 50 being electrically connected thereto. As an example, the circuit component 50 is a filtering capacitor, still indicated with the reference number 50, having its capacitor plates or rheophores 50r connected to respective conductive portions. The capacitor 50 is able to electrically connect to each other conductive portions that are apt to short-circuit contact elements apt to carry ground, power, or input/output signals. Advantageously, such an embodiment allows to maximize the filtering effect of the capacitors 50, and therefore to reduce the interferences caused by contact elements that carry ground and power signals to a minimum, as well as to optimize the loop-back technique, since said capacitors 50 are thus positioned as close as possible to the contact tips of the contact elements (i.e., on the lower guide 40), namely close to the wafer 27.

Alternatively, as shown in FIG. 10B, it is also possible to provide a configuration wherein the capacitor 50 has a first capacitor plate 50r1 connected to a conductive portion which includes a plurality of guide holes (the conductive portion 30' in the figure but not limited to this) and the other capacitor plate 50r2 connected to a conductive portion that includes and metallizes a single guide hole.

The circuit component 50, which is preferably a filtering capacitor, may also be any other component suited for specific needs, as for example an inductor or a resistor or a relay, possibly housed in suitable housing seats formed in the guide. For example, it is possible connect a pair of inductors at two conductive portions (such as the two first conductive portions 30' in the figure but not limited to these) apt to be short-circuited in a loop-back configuration and to monitor the signal at those conductive portions.

In conclusion, the present disclosure provides a testing head wherein at least one guide comprises at least one conductive portion that includes and electrically connects to each other guide holes apt to house contact elements carrying a same type of signal.

Advantageously according to the present disclosure, the contact elements that carry ground signals are therefore electrically connected in the testing head, preferably at the lower guide, which allows to considerably reduce (or even to completely eliminate) the signal noise generated by the different grounds, since the conductive portion of the guide forms a ground plane common to all the ground contact elements.

Similarly, also the electrical connection between the contact elements that carry power signals contributes to reducing interferences and therefore the noise in the testing head. In this way, advantageously according to the present disclosure, it is possible to reduce the common mode noise.

Consequently, the present disclosure allows an overall improvement of the frequency performances of the testing head.

Furthermore, also the electrical connection between contact elements that carry operating signals (i.e., input/output signals), preferably at the lower guide, allows an increase of the frequency performances of the testing head in case there is a need to electrically connect two or more contact pads of the device under test.

Advantageously, it is possible to short-circuit groups of probes to each other (and therefore also the corresponding pads of the device), without transporting the relative signal of the test equipment, said short-circuit occurring at the lower and/or intermediate guide, i.e., close to the device under test, in this way improving the electrical performances of the short-circuit.

The possibility of short-circuiting the ground and power contact elements allows to improve also the current performances of the testing head of the present disclosure, also avoiding possible burning of the contact elements.

It is also possible to obtain a testing head with improved performances in terms of signal filtering, thanks to the presence of suitable circuit components, in particular capacitors electrically connected to the conductive portions.

Finally, the presence of a common pad allows to access to the contact elements directly from the housing of the testing head, such a common pad therefore replacing the plurality of contact pads and also allowing monitoring of the respective signals.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A testing head configured to verify the operation of a device under test integrated on a semiconductor wafer, the testing head comprising:
   a plurality of contact elements, each including a body that extends between a first end portion and a second end portion, each contact element being a pogo pin, the body including:
   a casing having a first surface and a second surface; and
   an elastic member, in the casing, having a first end connected to the first end portion of the contact element and a second end connected to the second end portion of the contact element;
   at least one guide including a plurality of guide holes configured to house the contact elements,
   wherein the at least one guide comprises:
   a first conductive portion that includes and electrically connects a first group of guide holes, of the plurality of guide holes, to each other and is configured to contact corresponding first contact elements, of the plurality of contact elements, configured to carry a first type of signal, and
   a second conductive portion that includes and electrically connects the holes of a second group of guide holes, of the plurality of guide holes, to each other, and is configured to contact second contact elements of the plurality of contact elements, the second contact elements being configured to carry a second type of signal that is different to the first type of signal,
   wherein the first conductive portion and the second conductive portion are on a first face of the at least one guide and are physically and electrically separated from each other by at least one non-conductive zone.

2. The testing head of claim 1, wherein at least one of the first surface and second surface of each casing being configured to abut onto the at least one guide, and wherein an electrical connection between the first contact elements and the first conductive portion is a pressing contact with at least one of the first surface and the second surface of the casing, and an electrical connection between the second contact elements and the second conductive portion is in a pressing contact with at least one of the first surface and the second surface of the casing.

3. The testing head of claim 1, wherein the first type of signal is a ground signal and the second type of signal is a power signal.

4. The testing head of claim 1, wherein at least one of the first conductive portion and the second conductive portion are locally interrupted by at least one non-conductive zone.

5. The testing head of claim 1, wherein the at least one guide comprises at least one coating dielectric portion that covers the at least one non-conductive zone.

6. The testing head of claim 1, wherein the at least one guide is a lower guide, and wherein the testing head includes an upper guide separated from the lower guided by a gap, the first and second conductive portions are on a face of one of, or both, the upper and lower guides.

7. The testing head of claim 1, wherein the at least one guide includes at least one third conductive portion that includes and electrically connects a third group of guide holes, of the plurality of guide holes, to each other and is configured to contact third contact elements, of the plurality of contact elements, the third contact elements being configured to carry input/output signals between the device under test and a test equipment.

8. The testing head of claim 1, wherein the first type of signal and the second type of signal are selected from a ground signal, a power signal, or an input/output signal between the device under test and a test equipment.

9. A testing head configured to verify the operation of a device under test integrated on a semiconductor wafer, the testing head comprising:
   a plurality of contact elements, each comprising a body that extends between a first end portion and a second end portion,
   a first guide including a first plurality of guide holes apt to receive the contact elements, and
   a second guide spaced apart from the first guide, the second guide including a second plurality of guide holes apt to receive the contact elements, the contact elements being configured to extend through the first plurality of guide holes and the second plurality of guide holes,
   wherein the first guide comprises:
   a first conductive portion that includes and electrically connects a first group of guide holes, of the first plurality of guide holes, to each other and is configured to contact first contact elements of the plurality of contact elements, the first contact elements being configured to carry a first type of signal, and
   a second conductive portion that includes and electrically connects a second group of guide holes, of the first plurality of guide holes, to each other and is configured to contact second contact elements of the plurality of contact elements, the second contact elements being configured to carry a second type of signal that is different from the first type of signal,
   wherein the first conductive portion and the second conductive portion are formed on a face of the first guide facing the second guide, and wherein at least one of the first portion or the second portion is locally interrupted by at least one non-conductive zone.

10. The testing head of claim 9, wherein the first conductive portion and the second conductive portion are physically and electrically separated from each other by at least one non-conductive zone.

11. The testing head of claim 9, wherein the first type of signal is a ground signal, and the second type of signal is a power signal and comprising a plurality of second conductive portions for a plurality of different power signals.

12. The testing head of claim 9, wherein the first guide comprises at least one coating dielectric portion that covers the at least one non-conductive zone.

13. The testing head of claim 9, wherein the first guide is a lower guide and the second guide is an intermediate guide of the testing head, the lower guide being the guide closest to the device under test, the lower guide and the intermediate guide being separated from each other by a gap, or
   wherein the first guide is a lower guide and the second guide is an upper guide of the testing head, the lower guide being the guide closest to the device under test, the lower guide and the upper guide being separated from each other by a further gap.

14. The testing head of claim 9, wherein the first guide and the second guide are one of a lower guide, an intermediate guide, and an upper guide, the lower guide and the intermediate guide being separated from each other by a first gap, the intermediate guide and the upper guide being separated from each other by a second gap, each of the lower, intermediate and upper guides comprising respective guide holes for housing the contact elements, the first and second conductive portions being formed on a face of one or more of the upper, intermediate and lower guide.

15. The testing head of claim 9, wherein the first guide includes at least one third conductive portion that includes and electrically connects a third group of guide holes, of the first plurality of guide holes, to each other and is configured to contact third contact elements of the plurality of contact elements, the third contact elements being configured to carry input/output signals between the device under test and a test equipment.

16. The testing head of claim 9, wherein the contact elements are of the buckling beam type.

* * * * *